US012660426B2

(12) United States Patent
Shin et al.

(10) Patent No.: US 12,660,426 B2
(45) Date of Patent: Jun. 16, 2026

(54) DISPLAY DEVICE AND METHOD OF FABRICATING THE SAME

(71) Applicant: Samsung Display Co., LTD., Yongin-si (KR)

(72) Inventors: Hyun Eok Shin, Yongin-si (KR); Joon Yong Park, Yongin-si (KR); Ju Hyun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 449 days.

(21) Appl. No.: 18/371,370

(22) Filed: Sep. 21, 2023

(65) Prior Publication Data

US 2024/0215323 A1     Jun. 27, 2024

(30) Foreign Application Priority Data

Dec. 22, 2022     (KR) ........................ 10-2022-0181204

(51) Int. Cl.
H10K 59/122          (2023.01)
H10K 59/12           (2023.01)
H10K 59/80           (2023.01)

(52) U.S. Cl.
CPC ....... H10K 59/122 (2023.02); H10K 59/1201 (2023.02); H10K 59/8792 (2023.02)

(58) Field of Classification Search
CPC ............. H10K 59/122; H10K 59/1201; H10K 59/8792; H10K 59/38; H10K 59/1315;
(Continued)

(56) References Cited

U.S. PATENT DOCUMENTS 11,348,983 B1     5/2022   Choung et al.
2012/0228603 A1   9/2012   Nakamura
(Continued)

FOREIGN PATENT DOCUMENTS

CN      104272487 A      1/2015
KR      1020180028084 A  3/2018
KR      1020200009172    1/2020

OTHER PUBLICATIONS

Extended European Search Report issued May 13, 2024 in corresponding EP Application No. 23208930.0, 5 pages.

*Primary Examiner* — Anne M Hines
*Assistant Examiner* — Jose M Diaz
(74) *Attorney, Agent, or Firm* — CANTOR COLBURN LLP

(57) ABSTRACT

A display device includes a first pixel electrode disposed on a substrate; an inorganic insulating layer disposed on the substrate; a bank structure disposed on the inorganic insulating layer and including a first opening, which overlap with the first pixel electrode; a first light-emitting layer disposed on the first pixel electrode; and a first common electrode disposed on the first light-emitting layer. The bank structure includes a first bank layer, which is disposed directly on the inorganic insulating layer and includes MoTaOx, a second bank layer, which is disposed on the first bank layer and includes MoTaOx, and a third bank layer, which is disposed between the first bank layer and the second bank layer and includes copper (Cu). The second bank layer includes tips, which protrude beyond the third bank layer, on a sidewall of the first opening, and the first and second bank layers include different Ta contents.

20 Claims, 17 Drawing Sheets

CF: CF1, CF2, CF3
TFEL: TFE1, TFE2, TFE3
TFE1: TL1, TL2, TL3

(58) Field of Classification Search
CPC ..... H10K 59/1213; H10K 59/123–124; H10K
50/11; H10K 50/81–82; H10K 50/844;
H10K 50/865; H10K 71/00
See application file for complete search history.

(56) References Cited

U.S. PATENT DOCUMENTS

2021/0318564 A1    10/2021  Baek et al.
2022/0077251 A1*  3/2022  Choung ............... H10K 59/873

* cited by examiner

FIG. 6

CF: CF1, CF2, CF3
TFEL: TFE1, TFE2, TFE3
TFE1: TL1, TL2, TL3

DISPLAY DEVICE AND METHOD OF FABRICATING THE SAME

This application claims priority to Korean Patent Application No. 10-2022-0181204, filed on Dec. 22, 2022, and all the benefits accruing therefrom under 35 U.S.C. § 119, the content of which in its entirety is herein incorporated by reference.

BACKGROUND

1. Field

The disclosure relates to a display device and a method of fabricating the same.

2. Description of the Related Art

As the information society has developed, the demand for a display device for displaying images has diversified. For example, the display device has been applied to various electronic devices such as smart phones, digital cameras, notebook computers, navigation systems, and smart televisions. Here, the display device may be a flat panel display device such as a liquid crystal display ("LCD") device, a field emission display ("FED") device, or an organic light-emitting diode ("OLED") display device. A light-emitting display device, among such flat panel display devices, includes light-emitting elements capable of allowing the pixels of the display device to emit light, and can thus display an image without the need of a backlight unit for providing light to the display panel.

SUMMARY

Aspects of the disclosure provide a display device including a metal layer with a low external light reflectance and a method of fabricating the display device.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device includes: a first pixel electrode and a second pixel electrode disposed on a substrate to be spaced apart from each other; an inorganic insulating layer disposed on the substrate, part of which being on the first pixel electrode and the second pixel electrode; a bank structure disposed on the inorganic insulating layer and defining a first opening and a second opening therein, which overlap with the first pixel electrode and the second pixel electrode in a plan view, respectively; a first light-emitting layer and a second light-emitting layer disposed on the first pixel electrode and the second pixel electrode, respectively; and a first common electrode and a second common electrode disposed on the first light-emitting layer and the second light-emitting layer, respectively. The bank structure includes: a first bank layer, which is disposed directly on the inorganic insulating layer and includes MoTaOx, a second bank layer, which is disposed on the first bank layer and includes MoTaOx, and a third bank layer, which is disposed between the first bank layer and the second bank layer and includes copper (Cu). The second bank layer includes tips, which protrude beyond the third bank layer, on sidewalls of the first opening and the second opening, and the first bank layer and the second bank layer include different tantalum (Ta) contents from each other.

The first bank layer may include a Ta content of 2 atomic percentages (at %) or less, and the second bank layer may include a Ta content of 6 at % to 12 at %.

The first bank layer may have a thickness of 200 angstroms (Å) or less, and the second bank layer may have a thickness of 400 Å to 600 Å.

The third bank layer may be thicker than each of the first bank layer and the second bank layer.

A side surface of the first bank layer may be aligned with a side surface of the third bank layer in the first opening and the second opening.

The first common electrode and the second common electrode may be in direct contact with side surfaces of the third bank layer.

The first light-emitting layer and the second light-emitting layer may be in direct contact with the side surfaces of the third bank layer, and a contact area of the first light-emitting layer and the side surfaces of the third bank layer may be less than a contact area of the first common electrode and the side surfaces of the third bank layer.

The inorganic insulating layer may be not in contact with top surfaces of the first pixel electrode and the second pixel electrode, the first light-emitting layer may be disposed in part between the first pixel electrode and the inorganic insulating layer, and the second light-emitting layer may be disposed in part between the second pixel electrode and the inorganic insulating layer.

The display device may further include residual patterns disposed between the inorganic insulating layer and the first pixel electrode and between the inorganic insulating layer and the second pixel electrode.

The inorganic insulating layer may be disposed to be in direct contact with parts of top surfaces of the first pixel electrode and the second pixel electrode, and parts of the first light-emitting layer and the second light-emitting layer may be disposed directly on the inorganic insulating layer.

The display device may further include a first organic pattern disposed on the second bank layer to surround the first opening and including the same material as the first light-emitting layer, a first electrode pattern disposed on the first organic pattern and including the same material as the first common electrode, a second organic pattern disposed on the second bank layer to surround the second opening and including the same material as the second light-emitting layer, and a second electrode disposed on the second organic pattern and including the same material as the second common electrode.

The display device may further include a first inorganic layer disposed on the sidewall of the first opening and on the first common electrode and the first electrode pattern, and a second inorganic layer disposed on the sidewall of the second opening and on the second common electrode and the second electrode pattern, where the first inorganic layer and the second inorganic layer may be spaced apart from each other, and part of the second bank layer may do not overlap with the first inorganic layer and the second inorganic layer in the plan view.

The display device may further include a thin-film encapsulation layer disposed on the bank structure, wherein the thin-film encapsulation layer may include a first encapsulation layer, a second encapsulation layer, which is disposed on the first encapsulation layer, and a third encapsulation layer, which is disposed on the second encapsulation layer.

The display device may further include a light-blocking layer disposed on the third encapsulation layer and defining a plurality of opening holes, which overlap with the first opening and the second opening in the plan view, and a first color filter and a second color filter disposed on the light-blocking layer and overlapping with the first opening and the second opening in the plan view, respectively.

According to an embodiment of the disclosure, a method of fabricating a display device, includes: forming a plurality of pixel electrodes, which are spaced apart from one another, a sacrificial layer, which is disposed on the pixel electrodes, an inorganic insulating layer, which is disposed on the sacrificial layer, a first bank material layer, which is disposed on the inorganic insulating layer, and a second bank material layer, which is disposed on the first bank material layer, and a third bank material layer, which is disposed between the first bank material layer and the second bank material layer, on a substrate; forming a first hole, which overlaps with one of the pixel electrodes and exposes part of the sacrificial layer on the one of the pixel electrodes through the first, second, and third bank material layers and the inorganic insulating layer; removing part of the sacrificial layer and forming tips in the second bank material layer, which protrude beyond a sidewall of the third bank material layer, by wet-etching a sidewall of the first hole; forming a light-emitting layer and a common electrode on the pixel electrode in a first opening, which is obtained by the wet-etching the first hole, and forming an inorganic layer on the common electrode and the second bank material layer; and removing part of the inorganic layer on the second bank material layer, where the first bank material layer and the second bank material layer include MoTaOx, but have different Ta contents from each other, and the third bank material layer includes copper (Cu).

The first bank material layer may include a Ta content of 2 at % or less, and the second bank material layer may include a Ta content of 6 at % to 12 at %.

The first bank material layer may have a thickness of 200 Å or less, and the second bank material layer may have a thickness of 400 Å to 600 Å.

In the wet-etching of the sidewall of the first hole, the first bank material layer may be partially etched and a sidewall of the first bank material layer is aligned with the sidewall of the third bank material layer after the wet-etching.

The common electrode and the light-emitting layer may be in contact with the sidewall of the third bank material layer, and a contact area of the common electrode and the third bank material layer may be greater than a contact area of the light-emitting layer and the third bank material layer.

The forming of the light-emitting layer and the common electrode, may include forming an organic pattern, which is disposed on the second bank material layer and includes the same material as the light-emitting layer, and an electrode pattern, which is disposed on the organic pattern and includes the same material as the common electrode, and the inorganic layer may be disposed on the electrode pattern.

According to the aforementioned and other embodiments of the disclosure, as the uppermost metal layer of a bank structure includes a material with a low external light reflectance, the reflection of external light can be effectively reduced in a bank structure including openings, in which light-emitting elements are disposed, and excellent visibility can be provided to a user.

It should be noted that the effects of the disclosure are not limited to those described above, and other effects of the disclosure will be apparent from the following description.

4

BRIEF DESCRIPTION OF THE DRAWINGS

The above and other aspects and features of the disclosure will become more apparent by describing in detail embodiments thereof with reference to the attached drawings, in which:

FIG. 6 is a cross-sectional view of part of the display device of FIG. 2;

FIGS. 9 through 16 are cross-sectional views illustrating a method of fabricating a display device according to an embodiment of the disclosure.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments will be described with reference to the accompanying drawings.

Figure 1:
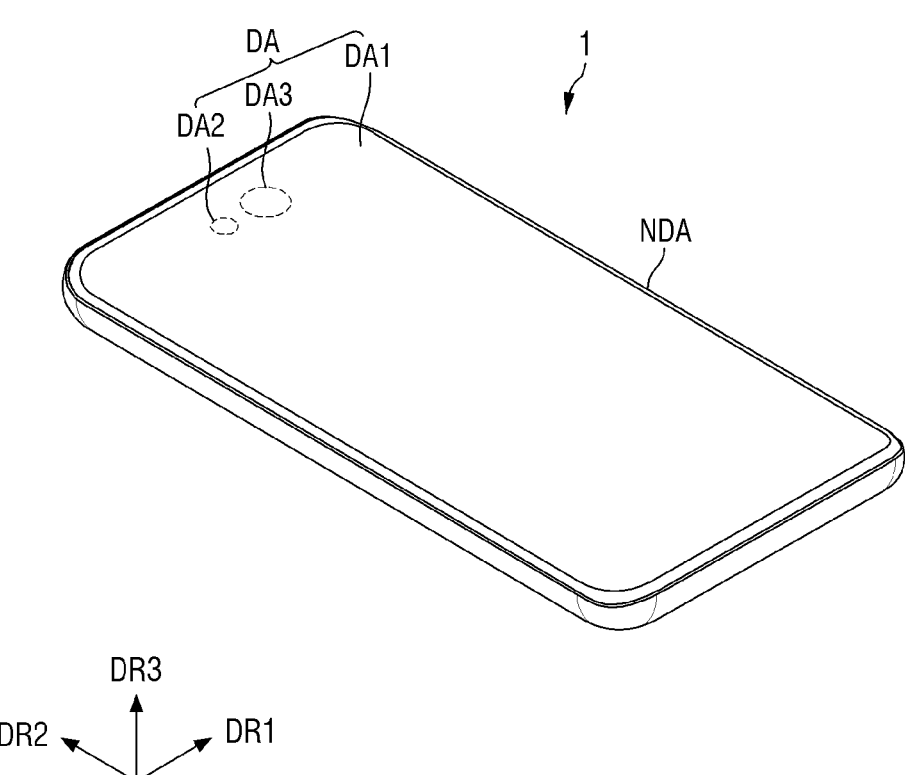
FIG. 1 is a perspective view of an electronic device according to an embodiment of the disclosure.

FIG. 1 is a perspective view of an electronic device according to an embodiment of the disclosure.

Referring to FIG. 1, an electronic device 1 displays a moving image or a still image. The electronic device 1 may refer to nearly all types of electronic devices providing a display screen. Examples of the electronic device 1 include a television ("TV"), a notebook computer, a monitor, an electronic billboard, an Internet-of-Things ("IoT") device, a mobile phone, a smartphone, a tablet personal computer ("PC"), an electronic watch, a smartwatch, a watchphone, a head-mounted display ("HMD"), a mobile communication terminal, an electronic notepad, an electronic book reader, a portable multimedia player ("PMP"), a navigation device, a gaming console, a digital camera, and a camcorder.

Figure 2:
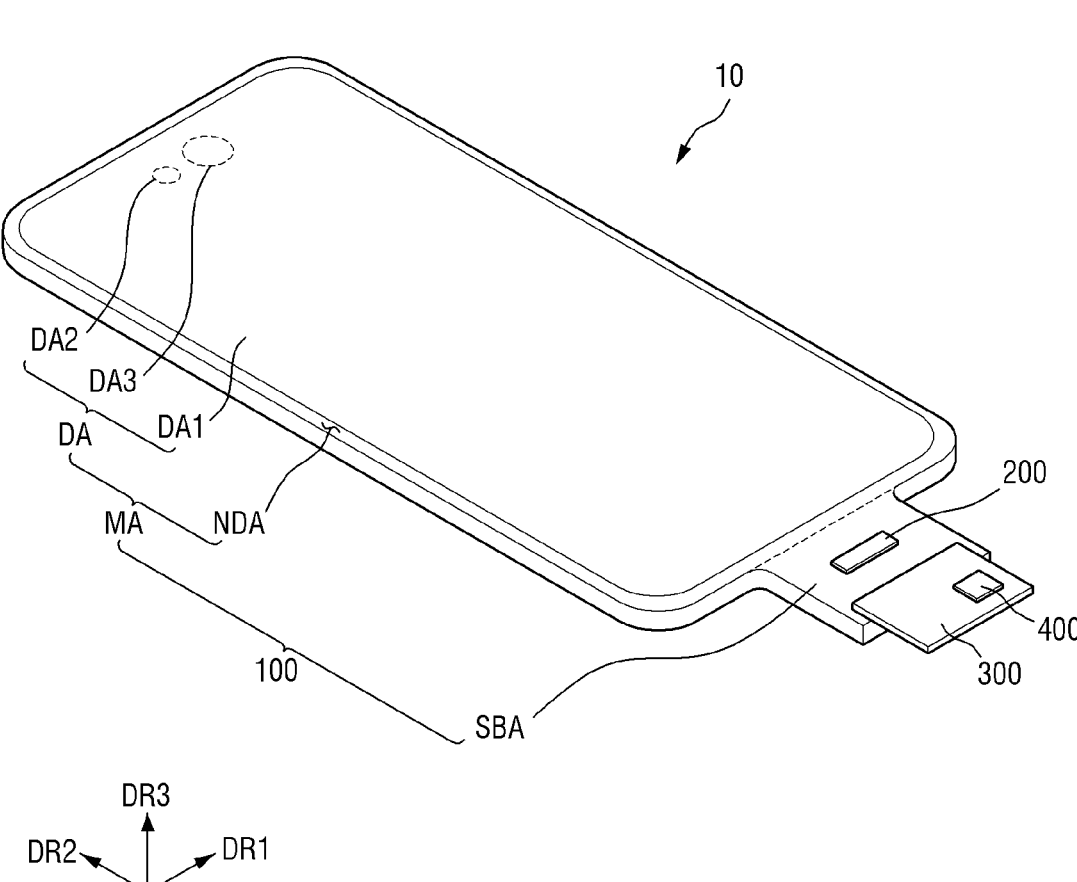
FIG. 2 is a perspective view of a display device included in the electronic device according to an embodiment of the disclosure.

The electronic device 1 may include a display device 10 of FIG. 2. Examples of the display device 10 include an inorganic light-emitting diode display device, an organic light-emitting diode (OLED) display device, a quantum-dot light-emitting display device, a plasma display device, and a field emission display (FED) device. The display device 10 will hereinafter be described as being, for example, an OLED display device, but the disclosure is not limited thereto. Obviously, the display device 10 may also be applicable to various other display devices. The shape of the electronic device 1 may vary. In an embodiment, for example, the electronic device 1 may have a rectangular shape that extends longer horizontally than vertically, a rectangular shape that extends longer vertically than horizontally, a square shape, a rectangular shape with rounded corners, another polygonal shape, or a circular shape. A display area DA of the electronic device 1 may generally have a similar shape to the electronic device 1. FIG. 1 illustrates that the electronic device 1 has a rectangular shape that extends longer in a second direction DR2 than in a first direction DR1.

The electronic device 1 may include a display area DA and a non-display area NDA. The display area DA may be an area where an image can be displayed, and the non-display area NDA may be an area where an image is not displayed. The display area DA may also be referred to as an active area, and the non-display area NDA may also be referred to as an inactive area. The display area DA may generally account for the middle of the electronic device 1.

The display area DA may include first, second, and third display areas DA1, DA2, and DA3. The second and third display areas DA2 and DA3 may be component areas where components for adding various functions are disposed.

FIG. 2 is a perspective view of a display device included in the electronic device of FIG. 1.

Referring to FIG. 2, the electronic device 1 of FIG. 1 may include the display device 10. The display device 10 may provide a display screen for the electronic device 1. The display device 10 may have a similar shape to the electronic device 1. In an embodiment, for example, the display device 10 may have an almost rectangular shape having short sides extending in the first direction DR1 and long sides extending in the second direction DR1. The corners where the short sides and the long sides of the display device 10 meet may be rounded to have a predetermined curvature or may be right-angled. The shape of the display device 10 is not particularly limited, and the display device 10 may have various other shapes such as another polygonal shape, a circular shape, or an elliptical shape.

The display device 10 may include a display panel 100, a display driving unit 200, a circuit board 300, and a touch driving unit 400.

The display panel 100 may include a main area MA and a subarea SBA.

The main area MA may include a display area DA, which includes pixels for displaying an image, and a non-display area NDA, which is disposed around the display area DA. The display area DA may include the first, second, and third display areas DA1, DA2, and DA3. The display area DA may emit light through a plurality of emission areas or openings. In an embodiment, for example, the display panel 100 may include pixel circuits including switching elements, a pixel-defining film defining the emission areas or the openings, and self-light-emitting elements.

In an embodiment, for example, the self-light-emitting elements may include organic light-emitting diodes (OLEDs), quantum-dot light-emitting diodes (LEDs) including a quantum-dot light-emitting layer, inorganic LEDs including an inorganic semiconductor, and/or micro-LEDs, but the disclosure is not limited thereto.

The non-display area NDA may be on the outside of the display area DA. The non-display area NDA may be defined as an edge part of the main area MA. The non-display area NDA may include a gate driving unit (not illustrated) providing gate signals to gate lines and fan-out lines (not illustrated) connecting the display driving unit 200 and the display area DA.

The subarea SBA may be an area extending from one side of the main area MA. The subarea SBA may include a flexible material that is bendable, foldable, or rollable. In an embodiment, for example, in a case where the subarea SBA is bendable, the subarea SBA may be bent to overlap with the main area MA in a thickness direction (i.e., a third direction DR3). The subarea SBA may include the display driving unit 200 and a pad unit, which is connected to the circuit board 300. The subarea SBA may not be provided, and the display driving unit 200 and the pad unit may be disposed in the non-display area NDA.

The display driving unit 200 may output signals and voltages for driving the display panel 100. The display driving unit 200 may provide data voltages to data lines. The display driving unit 200 may provide power supply voltages to power supply lines and may provide gate control signals to the gate driving unit. The display driving unit 200 may be formed as an integrated circuit ("IC") and may be mounted on the display panel 100 in a chip-on-glass ("COG") or chip-on-plastic ("COP") manner or via ultrasonic bonding. In an embodiment, for example, the display driving unit 200 may be disposed in the subarea SBA and may overlap with the main area MA in the thickness direction (i.e., a third direction DR3) when the subarea SBA is bent. In another example, the display driving unit 200 may be mounted on the circuit board 300.

The circuit board 300 may be attached to the pad unit of the display panel 100 via an anisotropic conductive film ("ACF"). Lead lines of the circuit board 300 may be electrically connected to the pad unit of the display panel 100. The circuit board 300 may be a printed circuit board ("PCB"), a flexible PCB ("FPCB"), or a flexible film such as a chip-on-film ("COF").

The touch driving unit 400 may be mounted on the circuit board 300. The touch driving unit 400 may be electrically connected to a touch sensing unit of the display panel 100.

The touch driving unit 400 may provide a touch driving signal to a plurality of touch electrodes of the touch sensing unit and may sense capacitance variations between the touch electrodes. In an embodiment, for example, the touch driving signal may be a pulse signal having a predetermined frequency. The touch driving unit 400 may calculate the presence and coordinates of input based on the capacitance variations between the touch electrodes. The touch driving unit 400 may be formed as an integrated circuit (IC).

Figure 3:
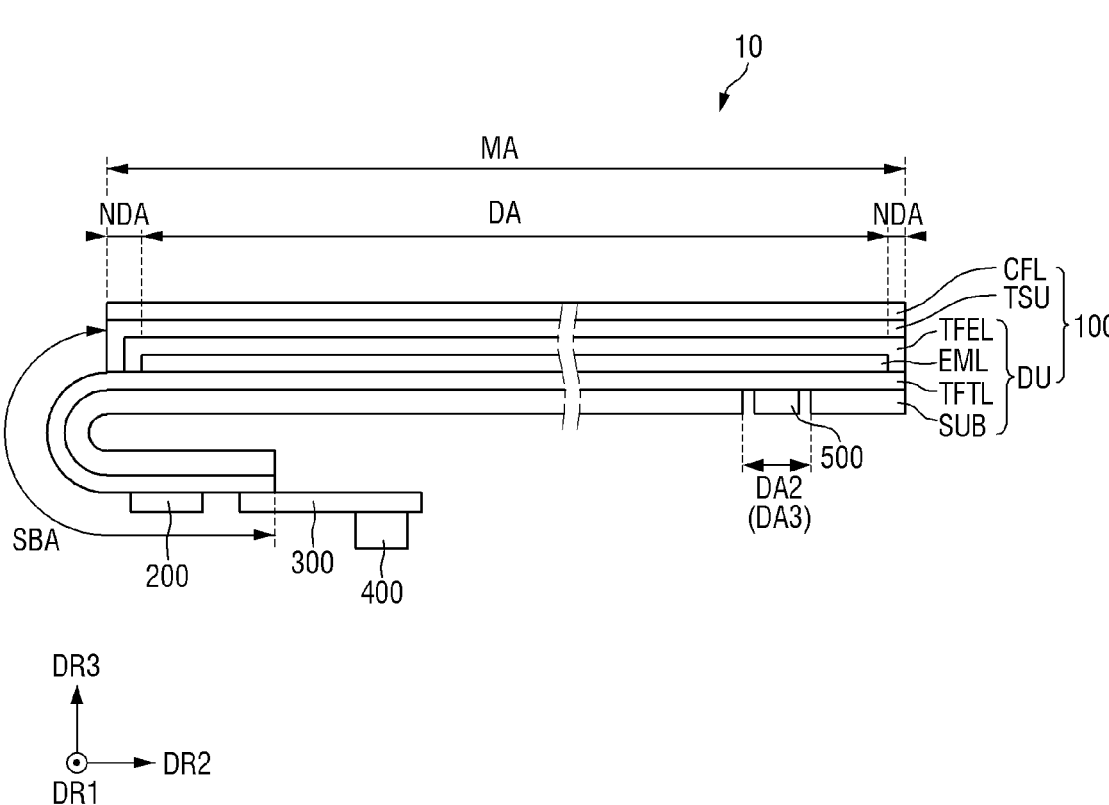
FIG. 3 is a cross-sectional view of the display device of FIG. 2.

FIG. 3 is a cross-sectional view of the display device of FIG. 2.

Referring to FIG. 3, the display panel 100 may include a display layer DU, a touch sensing layer TSU, and a color filer layer CFL. The display layer DU may include a substrate SUB, a thin-film transistor ("TFT") layer TFTL, a light-emitting element layer EML, and a thin-film encapsulation layer TFEL.

The substrate SUB may be a base substrate or a base member. The substrate SUB may be a flexible substrate that is bendable, foldable, or rollable. In an embodiment, for example, the substrate SUB may include a polymer resin such as polyimide ("PI"), but the disclosure is not limited thereto. In another example, the substrate SUB may include a glass material or a metal material.

The TFT layer TFTL may be disposed on the substrate SUB. The TFT layer TFTL may include a plurality of TFTs that form the pixel circuitry of pixels. The TFT layer TFTL may further include gate lines, data lines, power lines, gate control lines, and fan-out lines connecting the display driving unit 200 and the data lines, and lead lines connecting the display driving unit 200 and the pad unit. The TFTs may include semiconductor regions, source electrodes, drain electrodes, and gate electrodes. In an embodiment, for example, in a case where the gate driving unit is disposed on one side of the non-display area NDA of the display panel 100, the gate driving unit may include TFTs.

The TFT layer TFTL may be disposed in the display area DA, the non-display area NDA, and the subarea SBA. The TFTs, the gate lines, the data lines, and the power lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include a plurality of light-emitting elements, which include first electrodes, second electrodes, light-emitting layers and emit light, and a pixel-defining film, which defines the pixels. The light-emitting elements of the light-emitting element layer EML may be disposed in the display area DA.

The light-emitting layers may be organic light-emitting layers including an organic material. The light-emitting layers may include hole transport layers, organic light-emitting layers, and electron transport layers. As the first electrodes receive a voltage through the TFTs of the TFT layer TFTL and the second electrodes receive a cathode voltage, holes and electrons may move to the organic emission layers through the hole transport layers and the electron transport layers, respectively, and may combine together in the organic light-emitting layers to emit light.

Alternatively, the light-emitting elements may be quantum-dot light-emitting diodes (LEDs) including quantum-dot light-emitting layers, inorganic LEDs including an inorganic semiconductor, or micro-LEDs.

The display device 10 may include a plurality of color filters ("CF1", "CF2", and "CF3" of FIGS. 5 and 6), which are disposed on the light-emitting elements of the light-emitting element layer EML. Each of the color filters may selectively transmit light of a particular wavelength therethrough and may block or absorb light of other wavelengths. The color filters may absorb some of external light and may thus reduce reflected light of the external light. Accordingly, the color filters can prevent color distortions that may be caused by the reflection of external light. As the color filters are disposed on the light-emitting elements, the display device does not need a separate substrate for the color filters, and thus, the thickness of the display device 10 can be effectively reduced.

The thin film-encapsulation layer TFEL may cover the top surface and sides of the light-emitting element layer EML and may protect the light-emitting element layer EML. The thin film-encapsulation layer TFEL may include at least one inorganic film and at least one organic film for encapsulating the light-emitting element layer EML.

The touch sensing layer TSU may be disposed on the thin-film encapsulation layer TFEL. The touch sensing layer TSU may include a plurality of touch electrodes for detecting touch input from a user in a capacitive manner and touch lines for connecting the touch electrodes and the touch driving unit 400. In an embodiment, for example, the touch sensing layer TSU may sense touch input from the user in a mutual capacitance manner or in a self-capacitance manner.

Alternatively, in some embodiments, the touch sensing layer TSU may be disposed on a separate substrate on the display layer DU. In this case, the substrate supporting the touch sensing layer TSU may be a base member for encapsulating the display layer DU.

The touch electrodes of the touch sensing layer TSU may be disposed in a touch sensor area, which overlaps with the display area DA in a plan view. The touch lines of the touch sensing layer TSU may be disposed in a touch peripheral area, which overlaps with the non-display area NDA in a plan view.

In some embodiments, the display device 10 may further include an optical device 500. The optical device 500 may be disposed in the second or third display area DA2 or DA3. The optical device 500 may emit or receive infrared light, ultraviolet light, or visible light. In an embodiment, for example, the optical device 500 may be an optical sensor capable of sensing light incident upon the display device 10, such as a proximity sensor, a light sensor, a camera sensor, or an image sensor.

The color filter layer CFL may be disposed on the thin film-encapsulation layer TFEL. The color filter layer CFL may include a plurality of color filters, which correspond to a plurality of emission areas. Each of the color filters may selectively transmit light of a particular wavelength therethrough and may block or absorb light of other wavelengths. The color filter layer CFL may absorb some of light introduced into the display device 10 from the outside and may thus reduce reflected light of external light. Accordingly, the color filter layer CFL can prevent any color distortions that may be caused by the reflection of external light.

As the color filter layer CFL is disposed directly on the thin film-encapsulation layer TFEL, the display device 10 may not need a separate substrate for the color filter layer CFL. Accordingly, the thickness of the display device 10 may be relatively small.

Figure 4:
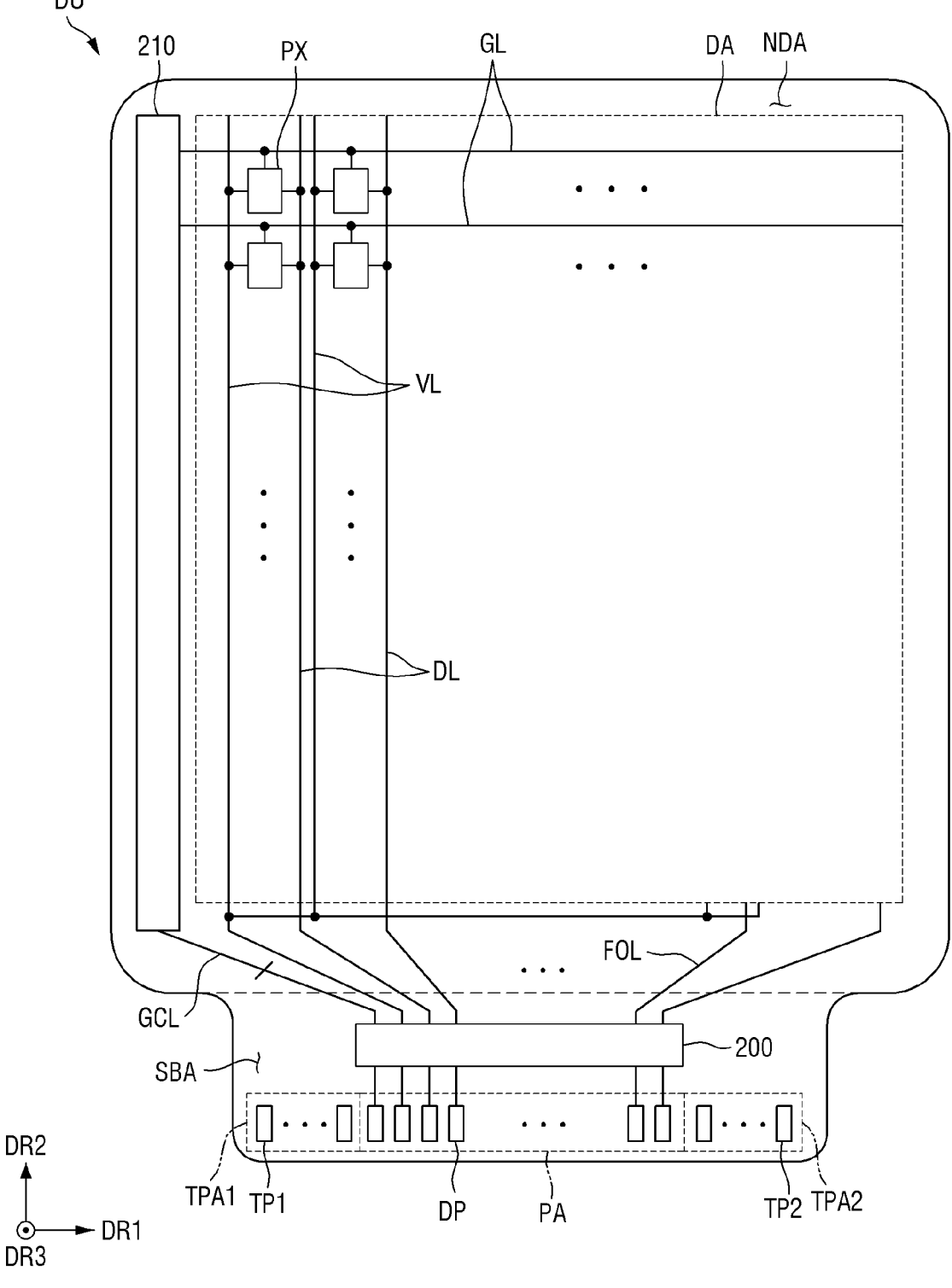
FIG. 4 is a plan view of a display layer of the display device of FIG. 2.

FIG. 4 is a plan view of the display layer of the display device of FIG. 2. As used herein, the "plan view" means a view in a thickness direction (i.e., third direction DR3) of the substrate SUB.

Referring to FIG. 4, the display layer DU may include the display area DA and the non-display area NDA.

The display area DA may be disposed in the middle of the display panel 100. A plurality of pixels PX, a plurality of gate lines GL, a plurality of data lines DL, and a plurality of power supply lines VL may be disposed in the display area DA. The pixels PX may be defined as minimal units for emitting light.

The gate lines GL may provide gate signals received from the gate driving unit 210 to the pixels PX. The gate lines GL may extend in the first direction DR1 and may be spaced apart from one another in the second direction DR2, which intersects the first direction DR1.

The data lines DL may provide data voltages received from the display driving unit 200 to the pixels PX. The data lines DL may extend in the second direction DR2 and may be spaced apart from one another in the first direction DR1.

The power supply lines VL may provide the power supply voltages received from the display driving unit 200 to the pixels PX. Here, the power supply voltages include a driving voltage, an initialization voltage, a reference voltage, and/or a low-potential voltage. The power supply lines VL may extend in the second direction DR2 and may be spaced apart from one another in the first direction DR1.

The non-display area NDA may surround the display area DA. The gate driving unit 210, fan-out lines FOL, and gate control lines CGL may be disposed in the non-display area NDA. The gate driving unit 210 may generate a plurality of gate signals based on the gate control signals and may sequentially provide the gate signals to the gate lines GL in a predefined order.

The fan-out lines FOL may extend from the display driving unit 200 to the display area DA. The fan-out lines FOL may provide data voltages received from the display driving unit 200 to the data lines DL.

The gate control lines CGL may extend from the display driving unit 200 to the gate driving unit 210. The gate control lines GCL may provide gate control signals received from the display driving unit 200 to the gate driving unit 210.

The subarea SBA may include the display driving unit 200, a pad area PA, and first and second touch areas TPA1 and TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the pixels PX and may control the luminance of the pixels PX. The display driving unit 200 may provide gate control signals to the gate driving unit 210 through the gate control lines GCL.

The pad area PA, the first touch pad area TPA1, and the second touch pad area TPA2 may be disposed on an edge of the subarea SBA. The pad area PA, the first touch pad area TPA1, and the second touch pad area TPA2 may be electrically connected to the circuit board 300 via an anisotropic conductive film ("ACF") or a self-assembly anisotropic conductive paste ("SAP").

The pad area PA may include a plurality of display pads DP. The display pads DP may be connected to a graphics system via the circuit board 300. The display pads DP may be connected to the circuit board 300 and may thus receive digital video data and provide the digital video data to the display driving unit 200.

Figure 5:
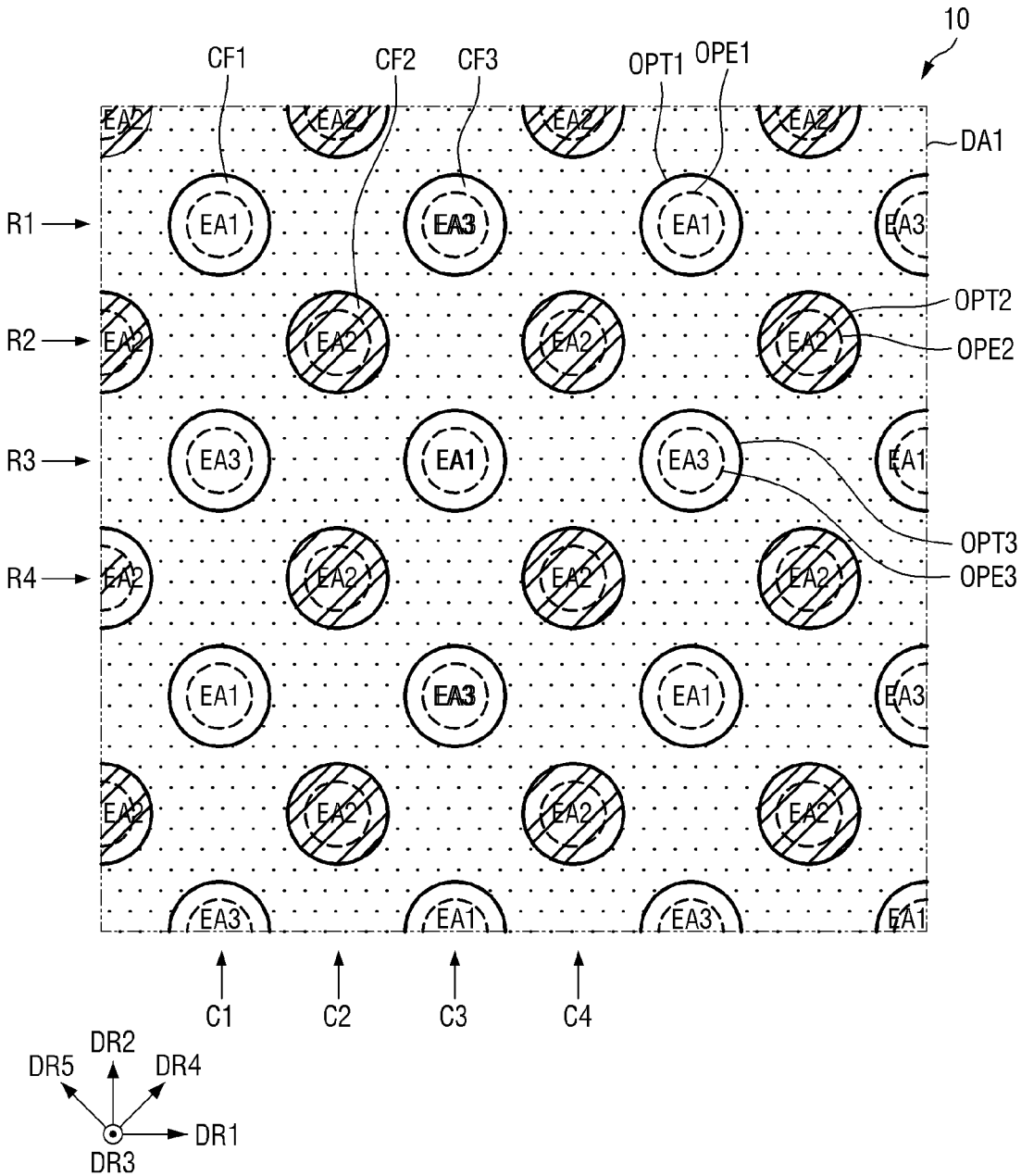
FIG. 5 is a plan view illustrating the layout of emission areas and color filters in a display area of the display device of FIG. 2.

FIG. 5 is a plan view illustrating the layout of emission areas and color filters in the display area of the display device of FIG. 2.

Referring to FIG. 5, the display device 10 may include a plurality of emission areas (EA1, EA2, and EA3), which are disposed in the display area DA. The display area DA of FIG. 3 is the first display area DA1, and the emission areas (EA1, EA2, and EA3) may be disposed in the first display area DA1. The emission areas (EA1, EA2, and EA3) may also be disposed in the second and third display areas DA2 and DA2.

The emission areas (EA1, EA2, and EA3) may include first emission areas EA1, second emission areas EA2, and third emission areas EA3, which emit different colors of light. The first emission areas EA1, the second emission areas EA2, and the third emission areas EA3 may emit red light, green light, and blue light, respectively, and the colors of beams of light emitted from the emission areas (EA1, EA2, and EA3) may vary depending on the types of light-emitting elements ("ED1", "ED2", and "ED3" of FIG. 6) disposed in the light-emitting element layer EML. In an embodiment, for example, the first emission areas EA1 may emit first light, which is red light, the second emission areas EA2 may emit second light, which is green light, and the third emission areas EA3 may emit third light, which is blue light. However, the disclosure is not limited to this example.

The emission areas (EA1, EA2, and EA3) may be arranged in a PenTile™ fashion, for example, in a diamond PenTile™ fashion. In an embodiment, for example, the first emission areas EA1 and the third emission areas EA3 may be spaced apart from one another in the first direction DR1 and may be alternately arranged in the first and second directions DR1 and DR2. In first and third rows R1 and R3, the first emission areas EA1 and the third emission areas EA3 may be alternately arranged in the first direction DR1, and in first and third columns C1 and C3, the first emission areas EA1 and the third emission areas EA3 may be alternately arranged in the second direction DR2.

The second emission areas EA2 may be spaced apart from one another in the first and second directions DR1 and DR2 and may be spaced apart from the first emission areas EA1 and the third emission areas EA3 in a fourth direction DR4 or a fifth direction DR5. The second emission areas EA2 may be repeatedly arranged in the first and second directions DR1 and DR2, and the second emission areas EA2 and the first emission areas EA1, or the second emission areas EA2 and the third emission areas EA3, may be alternately arranged in the fourth direction DR4 or the fifth direction DR5. In second and fourth rows R2 and R4, the second emission areas EA2 may be repeatedly arranged in the first direction DR1, and in second and fourth columns C2 and C4, the second emission areas EA2 may be repeatedly arranged in the second direction DR2.

The first emission areas EA1, the second emission areas EA2, and the third emission areas EA3 may be defined by a plurality of openings (OPE1, OPE2, and OPE3), which are defined in a bank structure ("BNS" of FIG. 6) of the light-emitting element layer EML. In an embodiment, for example, the first emission areas EA1 may be defined by first openings OPE1 of a pixel-defining film, the second emission areas EA2 may be defined by second openings OPE2 of the pixel-defining film, and the third emission areas EA3 may be defined by third openings OPE3 of the pixel-defining film.

Figure 6:
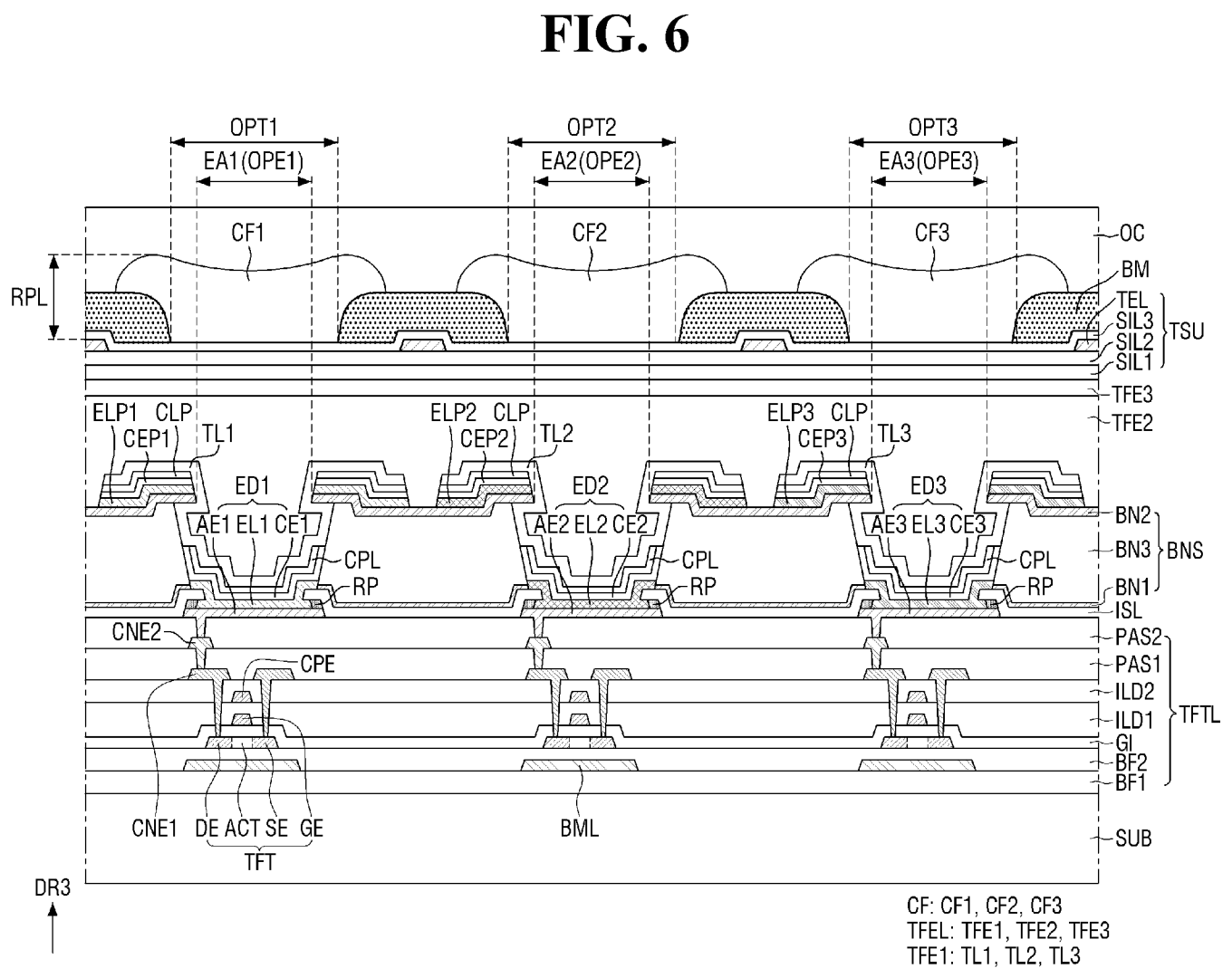

The size of the emission areas (EA1, EA2, and EA3) may vary depending on the size of the openings (OPE1, OPE2, and OPE3) of the bank structure. The intensity of light emitted from the emission areas (EA1, EA2, and EA3) may vary depending on the size of the emission areas (EA1, EA2, and EA3), and the color of a screen displayed by the display device 10 or the electronic device 1 may be controlled by controlling the size of the emission areas (EA1, EA2, and EA3). The first, second, and third emission areas EA1, EA2, and EA3 may have the same size. In the example of FIG. 6, the first, second, and third emission areas EA1, EA2, and EA3 may have the same size or diameter.

However, the disclosure is not limited to this. The size of the emission areas (EA1, EA2, and EA3) may be controlled freely in accordance with a screen color for the display device or the electronic device 1. The size of the emission areas (EA1, EA2, and EA3) may be associated with the efficiency and the life of the light-emitting elements (ED1, ED2, and ED3) and may be in a tradeoff relationship with the reflection of external light. The size of the emission areas (EA1, EA2, and EA3) may be controlled in consideration of all the above. In an embodiment, for example, the third emission areas EA3 may be larger in size than the first emission areas EA1 and the second emission areas EA2, and the first emission areas EA1 may be larger in size than the second emission areas EA2.

In the example of FIG. 5, one first emission area EA1, two second emission areas EA2, and one third emission area EA3 may form one pixel group. Each pixel group may include emission areas (EA1, EA2, and EA3) emitting different colors of light and may thus be able to display white gradation, but the disclosure is not limited thereto. The combination of emission areas (EA1, EA2, and EA3) forming each pixel group may vary depending on the layout of the emission areas (EA1, EA2, and EA3) and the colors of beams of light emitted from the emission areas (EA1, EA2, and EA3).

The display device 10 may include a plurality of color filters (CF1, CF2, and CF3), which are disposed in the emission areas (EA1, EA2, and EA3). The color filters (CF1, CF2, and CF3) may be disposed to correspond to the emission areas (EA1, EA2, and EA3). In an embodiment, for example, the color filters (CF1, CF2, and CF3) may be disposed in a plurality of opening holes (OPT1, OPT2, and OP3) of a light-blocking layer BM, which are disposed to correspond to the emission areas (EA1, EA2, and EA3) or the openings (OPE1, OPE2, and OPE3). The opening holes (OPT1, OPT2, and OPT3) of the light-blocking layer BM may be formed to overlap with the openings (OPE1, OPE2, and OPE3) in a plan view and may form light-output areas that output light emitted from the emission areas (EA1, EA2, and EA3). The color filters (CF1, CF2, and CF3) may have a larger area than the openings (OPE1, OPE2, and OPE3) and may completely cover the light-output areas formed by the opening holes (OPT1, OPT2, and OPT3) of the light-blocking layer BM.

The color filters (CF1, CF2, and CF3) may include first color filters CF1, second color filters CF2, and third color filters CF3, which are disposed to correspond to different emission areas (EA1, EA2, and EA3). The color filters (CF1, CF2, and CF3) may include a pigment or dye capable of absorbing light of all wavelength ranges except for a particular wavelength range and may be disposed to correspond to the colors of beams of light emitted from the emission areas (EA1, EA2, and EA3). In an embodiment, for example, the first color filters CF1 may be disposed to overlap with the first emission areas EA1 in a plan view and may be red color filters capable of transmitting only the first light, which is red light, therethrough. In an embodiment, for example, the second colors filter CF2 may be disposed to overlap with the second emission areas EA2 in a plan view and may be green color filters capable of transmitting only the second light, which is green light, therethrough, and the third color filters CF3 may be disposed to overlap with the third emission areas EA3 in a plan view and may be blue color filters capable of transmitting only the third light, which is blue light, therethrough.

The color filters (CF1, CF2, and CF3), like the emission areas (EA1, EA2, and EA3), may be arranged in a PenTile™ fashion, for example, in a diamond PenTile™ fashion. In an embodiment, for example, the first color filters CF1 and the third color filters CF3 may be alternately arranged in the first and second directions DR1 and DR2. In first and third rows R1 and R3, the first color filters CF1 and the third color filters CF3 may be alternately arranged in the first direction DR1, and in first and third columns C1 and C3, the first color filters CF1 and the third color filters CF3 may be alternately arranged in the second direction DR2.

The second color filters CF2 may be spaced apart from one another in the first and second directions DR1 and DR2 and may be spaced apart from the first color filters CF1 and the third color filters CF3 in the fourth direction DR4 or the second direction DR5. The second color filters CF2 may be repeatedly arranged in the first and second directions DR1 and DR2, and the second color filters CF2 and the first color filters CF1, or the second color filters CF2 and the third color filters CF2, may be alternately arranged in the fourth direction DR4 or the fifth direction DR5. In second and fourth rows R2 and R4, the second color filters CF2 may be repeatedly arranged in the first direction DR1, and in second and fourth columns C2 and C4, the second color filters CF2 may be repeatedly arranged in the second direction DR2.

Figure 7:
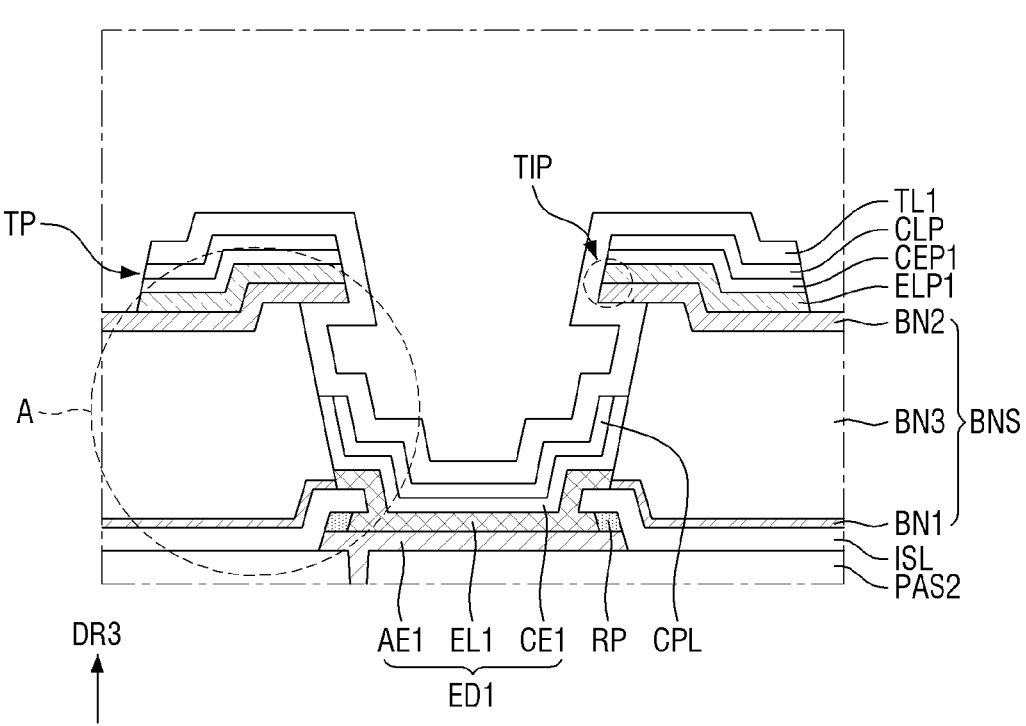
FIG. 7 is a cross-sectional view of a first emission area of FIG. 6.

FIG. 6 is a cross-sectional view of part of the display device of FIG. 1. FIG. 7 is a cross-sectional view of a first emission area of FIG. 6. FIG. 6 illustrates the substrate SUB, the TFT layer TFTL, the light-emitting element layer EML, the thin-film encapsulation layer TFEL, the touch sensing layer TSU, and the color filter layer CFL of the display layer DU. FIG. 7 illustrates parts of a first light-emitting element ED1 disposed in a first emission area EA1 of FIG. 6 and part of a bank structure BNS around the first light-emitting element ED1.

Referring to FIGS. 6 and 7 and further to FIG. 5, the display panel 100 of the display device 10 may include the display layer DU. The display layer DU may include the substrate SUB, the TFT layer TFTL, the light-emitting element layer EML, and the thin-film encapsulation layer TFEL. The display panel 100 may include the light-blocking layer BM as an antireflection layer RPL on the thin-film encapsulation layer TFEL, and may also include the color filters (CF1, CF2, and CF3) of the color filter layer CFL. The light-blocking layer BM may be disposed on the thin-film encapsulation layer TFEL, and the color filters (CF1, CF2, and CF3) may be disposed on the light-blocking layer BM. The color filter layer CFL and the light-blocking layer BM may function as antireflection members for the display device 10.

The substrate SUB may be a base substrate or a base member. The substrate SUB may be a flexible substrate that is bendable, foldable, or rollable. In an embodiment, for example, the substrate SUB may include a polymer resin such as PI, but the disclosure is not limited thereto. In another example, the substrate SUB may include a glass or metal material.

The TFT layer TFTL may include a first buffer layer BF1, a lower metal layer BML, a second buffer layer BF2, TFTs "TFT", a gate insulating layer GI, a first interlayer-insulating layer ILD1, capacitor electrodes CPE, a second interlayer-insulating layer ILD2, first connecting electrodes CNE1, a first passivation layer PAS1, second connecting electrodes CNE2, and a second passivation layer PAS2.

The first buffer layer BF1 may be disposed on the substrate SUB. The first buffer layer BF1 may include an inorganic film capable of preventing the infiltration of the air or moisture. In an embodiment, for example, the first buffer layer BF1 may include a plurality of inorganic films that are alternately stacked.

The lower metal layer BML may be disposed on the first buffer layer BF1. In an embodiment, for example, the lower metal layer BML may be formed as a single layer or a multilayer including molybdenum (Mo), aluminum (Al), chromium (Cr), gold (Au), titanium (Ti), nickel (Ni), neodymium (Nd), copper (Cu), or an alloy thereof, but the disclosure is not limited thereto.

The second buffer layer BF2 may cover the first buffer layer BF1 and the lower metal layer BML. The second buffer layer BF2 may include an inorganic film capable of preventing the infiltration of the air or moisture. In an embodiment, for example, the second buffer layer BF2 may include a plurality of inorganic films that are alternately stacked.

The TFTs "TFT" may be disposed on the second buffer layer BF2 and may form the pixel circuitry of a plurality of pixels. In an embodiment, for example, the TFTs "TFT" may be driving transistors or switching transistors. The TFTs "TFT" may include semiconductor layers ACT, source electrodes SE, drain electrodes DE, and gate electrodes GE.

The semiconductor layers ACT may be disposed on the second buffer layer BF2. The semiconductor layers ACT may overlap with the lower metal layer BML and the gate electrodes GE in the thickness direction (i.e., third direction DR3) and may be insulated from the gate electrodes GE by the gate insulating layer GI. Parts of the semiconductor layers ACT may be transformed into conductors and may thus form the source electrodes SE and the drain electrodes DE.

The gate electrodes GE may be disposed on the gate insulating layer GI. The gate electrodes GE may overlap with the semiconductor layers ACT with the gate insulating layer GI interposed therebetween in a plan view.

The gate insulating layer GI may be disposed on the semiconductor layers ACT. In an embodiment, for example, the gate electrodes GE may cover the semiconductor layers ACT and the second buffer layer BF2 and may insulate the semiconductor layers ACT and the gate electrodes GE. The gate insulating layer GI may include contact holes that are penetrated by the first connecting electrodes CNE1.

A first interlayer-insulating layer ILD1 may cover the gate electrodes GE and the gate insulating layer GI. The first interlayer-insulating layer ILD1 may include contact holes that are penetrated by the first connecting electrodes CNE1. The contact holes of the first interlayer-insulating layer ILD1 may be connected to the contact holes of the gate insulating layer GI and contact holes of a second interlayer-insulating layer ILD2.

The capacitor electrodes CPE may be disposed on the first interlayer-insulating layer ILD1. The capacitor electrodes CPE may overlap with the gate electrodes GE in the thickness direction (i.e., a third direction DR3). The capacitor electrodes CPE and the gate electrodes GE may form capacitors.

The second interlayer-insulating layer ILD2 may cover the capacitor electrodes CPE and the first interlayer-insulating layer ILD1. The second interlayer-insulating layer ILD2 may include contact holes that are penetrated by the first connecting electrodes CNE1. The contact holes of the second interlayer-insulating layer ILD2 may be connected to the contact holes of the first interlayer-insulating layer ILD1 and the contact holes of the gate insulating layer GI.

The first connecting electrodes CNE1 may be disposed on the second interlayer-insulating layer ILD2. The first connecting electrodes CNE1 may electrically connect the drain electrodes DE of the TFTs "TFT" and the second connecting electrodes CNE2. The first connecting electrodes CNE1 may be inserted in the contact holes of each of the second interlayer-insulating layer ILD2, the first interlayer-insulating layer ILD1, and the gate insulating layer GI and may thus be in contact with the drain electrodes DE of the TFTs "TFT".

The first passivation layer PAS1 may cover the first connecting electrodes CNE1 and the second interlayer-insulating layer ILD2. The first passivation layer PAS1 may protect the TFTs "TFT". The first passivation layer PAS1 may include contact holes that are penetrated by the second connecting electrodes CNE2.

The second connecting electrodes CNE2 may be disposed on the first passivation layer PAS1. The second connecting electrodes CNE2 may electrically connect the first connecting electrodes CNE1 and pixel electrodes (AE1, AE2, and AE3) of light-emitting elements (ED1, ED2, and ED3). The second connecting electrodes CNE2 may be inserted in the contact holes of the first passivation layer PAS1 and may be in contact with the first connecting electrodes CNE1.

The second passivation layer PAS2 may cover the second connecting electrodes CNE2 and the first passivation layer PAS1. The second passivation layer PAS2 may include contact holes that are penetrated by the pixel electrodes (AE1, AE2, and AE3) of the light-emitting elements (ED1, ED2, and ED3).

The light-emitting element layer EML may be disposed on the TFT layer TFTL. The light-emitting element layer EML may include the light-emitting elements (ED1, ED2, and ED3) and the metal structure BNS. The light-emitting elements (ED1, ED2, and ED3) may include the pixel electrodes (AE1, AE2, and AE3), light-emitting layers (EL1, EL2, and EL3), and common electrodes (CE1, CE2, and CE3).

The display device 10 may include a plurality of emission areas (EA1, EA2, and EA3), which are disposed in the display area DA. The emission areas (EA1, EA2, and EA3) may include first, second, and third emission areas EA1, EA2, and EA3, which emit different colors of light. The first, second, and third emission areas EA1, EA2, and EA3 may emit red light, green light, and blue light, respectively, and the colors of beams of light emitted from the emission areas (EA1, EA2, and EA3) may vary depending on the types of the light-emitting elements (ED1, ED2, and ED3) in the light-emitting element layer EML. In an embodiment, for example, the first emission area EA1 may emit first light, which is red light, the second emission area EA2 may emit second light, which is green light, and the third emission area EA3 may emit third light, which is blue light. However, the disclosure is not limited to this example.

The first, second, and third emission areas EA1, EA2, and EA3 may be defined by a plurality of openings (OPE1, OPE2, and OPE3), which are defined in the bank structure BNS of the light-emitting element layer EML. In an embodiment, for example, the first emission area EA1 may be defined by a first opening OPE1 of the bank structure BNS, the second emission area EA2 may be defined by a second opening OPE2 of the bank structure BNS, and the third emission area EA3 may be defined by a third opening OPE3 of the bank structure BNS.

The first, second, and third emission areas EA1, EA2, and EA3 may have the same size. In an embodiment, for example, the openings (OPE1, OPE2, and OPE3) of the bank structure BNS may have the same diameter, and the first, second, and third emission areas EA1, EA2, and EA3 may have the same size. However, the disclosure is not limited to this example. Alternatively, the first, second, and third emission areas EA1, EA2, and EA3 may have different sizes. In an embodiment, for example, the second emission area EA2 may be larger in size than the first and third emission areas EA1 and EA3, and the third emission area EA3 may be larger in size than the first emission area EA1. The intensity of light emitted by the emission areas (EA1, EA2, and EA3) may vary depending on the size of the emission areas (EA1, EA2, and EA3), and screen colors displayed by the display device 10 or the electronic device 1 may be controlled by controlling the size of the emission areas (EA1, EA2, and EA3). FIG. 5 illustrates that the first, second, and third emission areas EA1, EA2, and EA3 have the same size, but the disclosure is not limited thereto. The size of the emission areas (EA1, EA2, and EA3) may be freely controlled in accordance with the screen colors for the display device 10 or the electronic device 1. Also, the size of the emission areas (EA1, EA2, and EA3) may be related to the efficiency and lifetime of the light-emitting elements ED and may have a trade-off relation with the reflection of external light. The size of the emission areas (EA1, EA2, and EA3) may be controlled in consideration of all the above.

In the display device 10, one first emission area EA1, one second emission area EA2, and one third emission area EA3, which are disposed adjacent to one another, may form a single pixel group. One pixel group may include emission areas (EA1, EA2, and EA3) emitting different colors of light and may thus be able to display white gradation. However, the disclosure is not limited to this. That is, the combination of emission areas (EA1, EA2, and EA3) forming each pixel group may vary depending on the layout of the emission areas (EA1, EA2, and EA3) and the colors of light emitted from the emission areas (EA1, EA2, and EA3).

The display device 10 may include a plurality of light-emitting elements (ED1, ED2, and ED3), which are disposed in different emission areas (EA1, EA2, and EA3). The light-emitting elements (ED1, ED2, and ED3) may include first, second, and third light-emitting elements ED1, ED2, and ED3, which are disposed in the first, second, and third emission areas ED1, ED2, and ED3, respectively. The light-emitting elements (ED1, ED2, and ED3) may include the pixel electrodes (AE1, AE2, and AE3), the light-emitting layers (EL1, EL2, and EL3), and the common electrodes (CE1, CE2, and CE3) and may emit different colors of light depending on the material of the light-emitting layers (EL1, EL2, and EL3). In an embodiment, for example, the first light-emitting element ED1, which is disposed in the first emission area EA1, may emit the first light, i.e., red light, the second light-emitting element ED2, which is disposed in the second emission area EA2, may emit the second light, i.e., green light, and the third light-emitting element ED3, which is disposed in the third emission area EA3, may emit the third light, i.e., blue light. The first, second, and third emission areas EA1, EA2, and EA3, which form one pixel together, may include the first, second, and third light-emitting elements ED1, ED2, and ED3, which emit different colors of light, respectively, and may thus be able to display white gradation.

The pixel electrodes (AE1, AE2, and AE3) may be disposed on the second passivation layer PAS2. The pixel electrodes (AE1, AE2, and AE3) may be disposed to overlap with first, second, and third openings OPE1, OPE2 and OPE3 of a pixel-defining film PDL in a plan view. The pixel electrodes (AE1, AE2, and AE3) may be electrically connected to the drain electrodes DE of the TFTs "TFT" via the first connecting electrodes CNE1 and the second connecting electrodes CNE2.

The pixel electrodes (AE1, AE2, and AE3) may be disposed in the emission areas (EA1, EA2, and EA3). The pixel electrodes (AE1, AE2, and AE3) may include a first pixel electrode AE1, which is disposed in the first emission area EA1, a second pixel electrode AE2, which is disposed in the second emission area EA2, and a third pixel electrode AE3, which is disposed in the third emission area EA3. The first, second, and third pixel electrodes AE1, AE2, and AE3 may be spaced apart from one another on the second passivation layer PAS2. The pixel electrodes (AE1, AE2, and AE3) may be disposed in different emission areas (EA1, EA2, and AE3) and may thus form different light-emitting elements (ED1, ED2, and ED3) emitting different colors of light.

The pixel electrodes (AE1, AE2, and AE3) may have a structure in which a high work function material layer including indium tin oxide ("ITO"), indium zinc oxide ("IZO"), zinc oxide (ZnO), or indium oxide ($In_2O_3$) and a reflective material layer including silver (Ag), magnesium (Mg), Al, platinum (Pt), lead (Pb), palladium (Pd), gold (Au), nickel (Ni), neodymium (Nd), iridium (Ir), Cr, lithium (Li), calcium (Ca), or a mixture thereof are stacked. The high work function material layer may be disposed above the reflective material layer, close to the light-emitting layers (EL1, EL2, and EL3). In an embodiment, for example, the pixel electrodes (AE1, AE2, and AE3) may have a multi-layer structure of ITO/Mg, ITO/MgF, ITO/Ag, or ITO/Ag/ITO, but the disclosure is not limited thereto.

An inorganic insulating layer ISL may be disposed on the second passivation layer PAS2 and the pixel electrodes (AE1, AE2, and AE3). The inorganic insulating layer ISL may be disposed on the entire second passivation layer PAS2 and may partially overlap with the pixel electrodes (AE1, AE2, and AE3) to expose parts of the top surfaces of the pixel electrodes (AE1, AE2, and AE3) in a plan view. In an embodiment, for example, the inorganic insulating layer ISL may expose the pixel electrodes (AE1, AE2, and AE3) in areas that overlap with the openings (OPE1, OPE2, and OPE3) of the bank structure BNS in a plan view, and the light-emitting layers (EL1, EL2, and EL3) may be disposed directly on the pixel electrodes (AE1, AE2, and AE3). The inorganic insulating layer ISL may include an inorganic insulating material. In an embodiment, for example, the inorganic insulating layer ISL may include aluminum oxide, titanium oxide, tantalum oxide, hafnium oxide, zinc oxide, silicon oxide, silicon nitride, and/or silicon oxynitride.

The inorganic insulating layer ISL may be disposed on the pixel electrodes (AE1, AE2, and AE3) and may be spaced apart from the top surfaces of the pixel electrodes (AE1, AE2, and AE3). The inorganic insulating layer ISL may not be in direct contact with the pixel electrodes (AE1, AE2, and AE3), partially overlapping with the pixel electrodes (AE1, AE2, and AE3) in a plan view, and parts of the light-emitting layers (EL1, EL2, and EL3) of the light-emitting elements (ED1, ED2, and ED3) may be disposed between the inorganic insulating layer ISL and the pixel electrodes (AE1, AE2, and AE3). During the fabrication of the display device 10, a sacrificial layer ("SFL" of FIG. 9) may be disposed on the pixel electrodes (AE1, AE2, and AE3) before the formation of the inorganic insulating layer ISL. The inorganic insulating layer ISL may be initially disposed to cover part of the sacrificial layer, and may be spaced apart from the top surfaces of the pixel electrodes (AE1, AE2, and AE3) in response to the sacrificial layer being removed. During deposition processes for forming the light-emitting layers (EL1, EL2, and EL3), the material of the light-emitting layers (EL1, EL2, and EL3) may fill the gaps between the inorganic insulating layer ISL and the pixel electrodes (AE1, AE2, and AE3), and the inorganic insulating layer ISL may be disposed in part on the light-emitting layers (EL1, EL2, and EL3). However, the inorganic insulating layer ISL may be in direct contact with side surfaces of each of the pixel electrodes (AE1, AE2, and AE3).

The display device 10 may include the bank structure BNS, which is disposed on the TFT layer TFTL or the substrate SUB and includes the openings (OPE1, OPE2, and OPE3). The bank structure BNS may have a structure in which a plurality of bank layers including different materials, i.e., first and second bank layers BN1 and BN2, are sequentially stacked, and may include the openings (OPE1, OPE2, and OPE3), which form the emission areas (EA1, EA2, and EA3). The light-emitting elements (ED1, ED2, and ED3) of the display device 10 may be disposed to overlap with the openings (OPE1, OPE2, and OPE3) of the bank structure BNS in a plan view.

The bank structure BNS may include first and second bank layers BN1 and BN2, which are disposed on the inorganic insulating layer ISL, and a third bank layer BN3, which is disposed on the first and second bank layers BN1 and BN2. The bank structure BNS may have a structure in which the first bank layer BN1, the third bank layer BN3, and the second bank layer BN2 are sequentially stacked. The first bank layer BN1 may be the lowermost layer of the bank structure BNS, the second bank layer BN2 may be the uppermost layer of the bank structure BNS, and the third bank layer BN3 may be the middle layer of the bank structure BNS.

Figure 8:
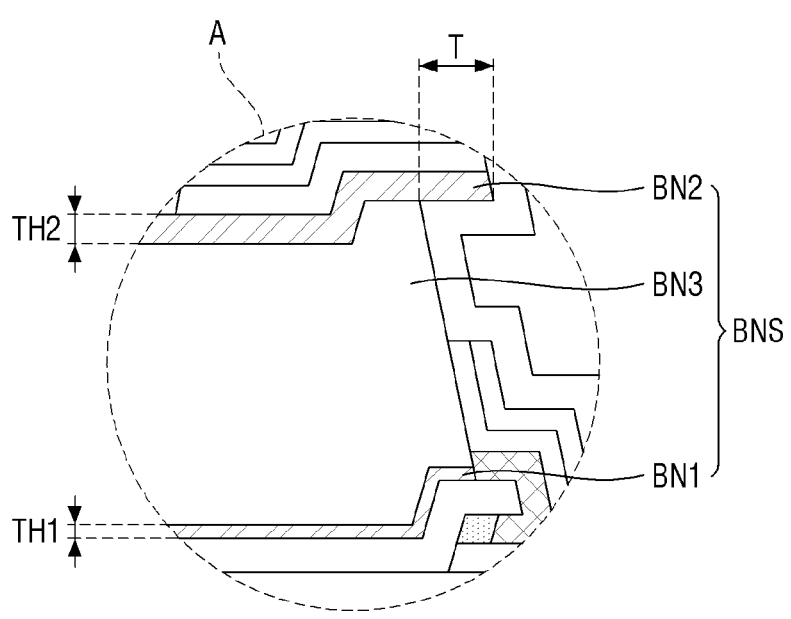
FIG. 8 is an enlarged cross-sectional view of an area A of FIG. 7.

FIG. 8 is an enlarged cross-sectional view of an area A of FIG. 7.

Referring to FIG. 8 and further to FIG. 7, the first and second bank layers BN1 and BN2 may include substantially the same material, and the third bank layer BN3 may include a different material from the first and second bank layers BN1 and BN2. The first, second, and third bank layers BN1, BN2, and BN3 may include a metal material, but as the third bank layer BN3 includes a different metal material from the first and second bank layers BN1 and BN2, the third bank layer BN3 may function differently from the first and second bank layers BN1 and BN2. The third bank layer BN3 may include a metal material with a high electrical conductivity, and the first and second bank layers BN1 and BN2 may include a metal material with a low reflectance.

In an embodiment, for example, the first and second bank layers BN1 and BN2 may include $MoTaO_x$, and the third bank layer BN3 may include Cu. The bank structure BNS may have a structure in which a $MoTaO_x$ layer, a Cu layer, and a $MoTaO_x$ layer are sequentially stacked, on the inorganic insulating layer ISL, and tips TIP may be disposed in one of the $MoTaO_x$ layers of the bank structure, particularly, in the second bank layer BN2. The first bank layer BN1, which is the lowermost layer of the bank structure BNS, may be disposed directly on the inorganic insulating layer ISL and may function as a base layer, on which to arrange the third bank layer BN3. The third bank layer BN3 may include Cu, which has a high electrical conductivity, and may thus be electrically connected to the common electrodes (CE1, CE2, and CE3) of the light-emitting elements (ED1, ED2, and ED3). The second bank layer BN2, which is the uppermost layer of the bank structure BNS, may include a material with a high light absorption and may thus effectively reduce the reflection of external light. The first and second bank layers BN1 and BN2 may include Mo and may thus have a higher light absorption, or a lower reflectance, than Ti. The first and second bank layers BN1 and BN2 may also include $TaO_x$ and may thus have a low solubility. As the bank structure BNS includes the openings (OPE1, OPE2, and OPE3), the bank structure BNS can form spaces in which to arrange the light-emitting elements (ED1, ED2, and ED3). Also, as the bank structure BNS is electrically connected to the light-emitting elements (ED1, ED2, and ED3) and includes a material with a low reflectance, the visibility of the display device 10 can be effectively improved.

The bank structure BNS may include tips TIP in the second bank layer BN2, which protrude toward the inside of the openings (OPE1, OPE2, and OPE3) beyond side surfaces of the third bank layer BN3. On the contrary, the first bank layer BN1 may not protrude beyond the side surfaces of the third bank layer BN3. The side surfaces of the third bank layer BN3 may be inwardly recessed from side surfaces of the second bank layer BN2, but may be almost parallel to side surfaces of the first bank layer BN1. The third bank layer BN3 may be thicker than each of the first bank layer BN1 and the second bank layer BN2, and the first and second bank layers BN1 and BN2 may be relatively thin. The first and second bank layers BN1 and BN2 may include substantially the same material, but may have different contents of the corresponding material, and thus, the tips TIP may be disposed only in the second bank layer BN2. As the second bank layer BN2 protrudes toward the openings (OPE1, OPE2, and OPE3) beyond the third bank layer BN3, undercuts may be disposed on the inner sidewalls of the openings (OPE1, OPE2, and OPE3), below the tips TIP of the second bank layer BN2.

The bank structure BNS may have the aforementioned sidewall structure because the first, second, and third bank layers BN1, BN2, and BN3 include different materials and are thus etched at different rates. The second bank layer BN2 may include a material that is etched slower than the third bank layer BN3, and the first bank layer BN1 may be more etched than the third bank layer BN3 during the formation of the openings (OPE1, OPE2, and OPE3) so that undercuts may be formed below the tips TIP of the second bank layer BN2.

As already mentioned above, the third bank layer BN3 may include Cu, and the first and second bank layers BN1 and BN2 may include $MoTaO_x$. During the formation of the openings (OPE1, OPE2, and OPE3) of the bank structure BNS, the third bank layer BN3 may be etched by a larger amount than the second bank layer BN2, and as a result, the tips TIP of the second bank layer BN2 may be formed. The first bank layer BN1, like the second bank layer BN2, may include $MoTaO_x$, but may have a different tantalum (Ta) content from the second bank layer BN2. The second bank layer BN2 may have a Ta content of 6 at % or greater, and the first bank layer BN1 may have a Ta content of 2 at % or less. Due to the difference in Ta content between the first and second bank layers BN1 and BN2, the first and second bank layers BN1 and BN2 may be etched at different rates for the same etchant. The length of tips TIP disposed in a $MoTaO_x$ layer during an etching process may vary depending on the Ta content of the MoTaO$_x$ layer. As the second bank layer BN2 has a relatively high Ta content, tips TIP may be disposed in the second bank layer BN2 to protrude beyond the side surfaces of the third bank layer BN3. On the contrary, as the first bank layer BN1 has a relatively low Ta content, no tips may be disposed in the first bank layer BN1. The first bank layer BN1 may have a Ta content of 0.5 at % to 2 at %, and the second bank layer BN2 may have a Ta content of 6 at % to 12 at %. When the second bank layer BN2 has a Ta content of 6 at % to 12 at %, the tips TIP of the second bank layer BN2 may have a width T of 0.2 μm or greater. Specifically, when the second bank layer BN2 has a Ta content of 6 at %, the width T of the tips TIP of the second bank layer BN2 may be 0.2 fem, and as the Ta content of the second bank layer BN2 increases, the width W of the tips TIP of the second bank layer BN2 may also increase.

The first and second bank layers BN1 and BN2, which are the lowermost and uppermost layers, respectively, of the bank structure BNS, may function differently. In an embodiment, for example, the first bank layer BN1 may be disposed directly on the inorganic insulating layer ISL to maintain its adhesiveness for the third bank layer BN3, which includes Cu. The second bank layer BN2 may be disposed on the third bank layer BN3 to absorb external light and thus to reduce the reflection of external light. Accordingly, the first and second bank layers BN1 and BN2 may have different Ta contents and may thus have different thicknesses.

A thickness TH1 of the first bank layer BN1 may be less than a thickness TH2 of the second bank layer BN2. In an embodiment, for example, the thickness TH1 of the first bank layer BN1 may be 100 Å to 200 Å, and the thickness TH2 of the second bank layer BN2 may be 400 Å to 600 Å. The first bank layer BN1 may have a low Ta content and may thus be thin enough to leave any remnants during etching. However, the first bank layer BN1 may be thick enough to be properly bonded to at least the third bank layer BN3, which includes Cu. The second bank layer BN2 may have a thickness of at least 400 Å to have a sufficiently low external light reflectance. However, when the second bank layer BN2 has a thickness of 600 Å or greater, the reflectance of the second bank layer BN2 may decrease. Thus, the thickness TH2 of the second bank layer BN2 may be less than 600 Å. The third bank layer BN3 may be thicker than the first bank layer BN1 and the second bank layer BN2. As will be described later, the third bank layer BN3 may be in contact with, and electrically connected to, the common electrodes (CE1, CE2, and CE3) of the light-emitting elements (ED1, ED2, and ED3) and may thus have a low resistance and a high electrical conductivity. In an embodiment, for example, the third bank layer BN3 may have a thickness of 4000 Å to 10000 Å or about 6000 Å.

The bank structure BNS may include the openings (OPE1, OPE2, and OPE3), which form the emission areas (EA1, EA2, and EA3), and the light-blocking layer BM may be disposed on the bank structure BNS. The uppermost layer of the bank structure BNS may include a material with low reflectance and may thus be able to effectively reduce the reflection of external light. Also, the third bank layer BN3 of the bank structure BNS may be electrically connected to the common electrodes (CE1, CE2, and CE3) of the light-emitting elements (ED1, ED2, and ED3). The light-emitting elements (ED1, ED2, and ED3), which are disposed in the emission areas (EA1, EA2, and EA3), may not be directly connected to the common electrodes (CE1, CE2, and CE3), but may be electrically connected to the common electrodes (CE1, CE2, and CE3) through the third bank layer BN3 of the bank structure BNS.

During the fabrication of the display device 10, mask processes may be desirable to form a pixel-defining film, which forms the emission areas (EA1, EA2, and EA3), of an organic material and to form the light-emitting layers (EL1, EL2, and EL3) in the emission areas (EA1, EA2, and EA3). In order to perform the mask processes, the display device 10 may require a structure for mounting masks or an unnecessarily large-size non-display area NDA to control dispersion in accordance with the mask processes. If the mask processes are minimized, unnecessary components such as, for example, the structure for mounting masks, may not be provided in the display device 10, and the size of the non-display area NDA for the control of dispersion control can be minimized.

The display device 10 may include the bank structure BNS, which forms the light emitting areas EA1, EA2, and EA3, and the bank structure BNS may be formed by deposition and etching processes without using a mask. Also, as the bank structure BNS includes the first, second, and third bank layers BN1, BN2, and BN3, which include different metal materials and the inner sidewalls of the openings (OPE1, OPE2, and OPE3) include tips TIP, different layers can be formed separately in different emission areas (EA1, EA2, and EA3), simply through deposition. In an embodiment, for example, even if the light-emitting layers (EL1, EL2, and EL3) and the common electrodes (CE1, CE2, and CE3) of the light-emitting elements (ED1, ED2, and ED3) are formed by deposition processes not using masks, deposited materials for forming the light-emitting layers (EL1, EL2, and EL3) and the common electrodes (CE1, CE2, and CE3) of the light-emitting elements (ED1, ED2, and ED3) may not be connected, but disconnected between the openings (OPE1, OPE2, and OPE3) by the tips TIP of the second bank layer BN2, which are disposed on the inner sidewalls of the openings (OPE1, OPE2, and OPE3). After the formation of a particular layer through deposition on the entire surface of the display device 10, the particular layer may be etched away from undesignated areas. In this manner, different layers can be disposed in different emission areas (EA1, EA2, and EA3). Different light emitting devices (ED1, ED2, and ED3) can be disposed in different emission areas (EA1, EA2, and EA3) through deposition and etching, without a requirement of a mask process, unnecessary components can be omitted from the display device, and the size of the non-display area NDA can be minimized.

The light-emitting layers (EL1, EL2, and EL3) may be disposed on the pixel electrodes (AE1, AE2, and AE3). The light-emitting layers (EL1, EL2, and EL3) may be organic light-emitting layers formed of or including an organic material and may be disposed on the pixel electrodes (AE1, AE2, and AE3) through deposition. The light-emitting layers (EL1, EL2, and EL3) may apply a predetermined voltage to the pixel electrodes (AE1, AE2, and AE3) of the light-emitting elements (ED1, ED2, and ED3), and when common electrodes (CE1, CE2, and CE3) of the light-emitting elements (ED1, ED2, and ED3) receive a common voltage or a cathode voltage, holes and electrons may move to the light-emitting elements (ED1, ED2, and ED3) through a hole transport layer and an electron transport layer and may combine together in the light-emitting layers (EL1, EL2, and EL3) to emit light.

The light-emitting layers (EL1, EL2, and EL3) may include first, second, and third light-emitting layers EL1, EL2, and EL3, which are disposed in different emission areas (EA1, EA2, and EA3). The first light-emitting layer EL1 may be disposed on the first pixel electrode AE1, in the first emission area EA1, the second light-emitting layer EL2 may be disposed on the second pixel electrode AE1, in the second emission area EA2, and the third light-emitting layer EL3 may be disposed on the third pixel electrode AE3, in the third emission area EA3. The first, second, and third light-emitting layers EL1, EL2, and EL3 may be the light-emitting layers of the first, second, and third light-emitting elements ED1, ED2, and ED3. The first light-emitting layer EL1 may be a light-emitting layer emitting the first light, i.e., red light, the second light-emitting layer EL2 may be a light-emitting layer emitting the second light, i.e., green light, and the third light-emitting layer EL3 may be a light-emitting layer emitting the third light, i.e., blue light.

The light-emitting layers (EL1, EL2, and EL3) of the light-emitting elements (ED1, ED2, and ED3) may be disposed in part between the inorganic insulating layer ISL and the pixel electrodes (AE1, AE2, and AE3). The inorganic insulating layer ISL may be disposed on the pixel electrodes (AE1, AE2, and AE3) and may be spaced apart from the top surfaces of the pixel electrodes (AE1, AE2, and AE3). The deposition of the light-emitting layers (EL1, EL2, and EL3) may be performed diagonally, rather than perpendicularly, with respect to the top surface of the substrate SUB. As a result, the light-emitting layers (EL1, EL2, and EL3) may be disposed on parts of the top surfaces of the pixel electrodes (AE1, AE2, and AE3) that are exposed by the openings (OPE1, OPE2, and OPE3) of the bank structure BNS, and may fill the spaces between the inorganic insulating layer ISL and the pixel electrodes (AE1, AE2, and AE3).

During the fabrication of the display device 10, a sacrificial layer ("SFL" of FIG. 8) may be disposed between the inorganic insulating layer ISL and the pixel electrodes (AE1, AE2, and AE3), and the light-emitting layers (EL1, EL2, and EL3) may be disposed in regions from which parts of the sacrificial layer are removed. As a result, the bottom surface of the inorganic insulating layer ISL may be spaced apart from the pixel electrodes (AE1, AE2, and AE3). The sacrificial layer may remain between the inorganic insulating layer ISL and the pixel electrodes (AE1, AE2, and AE3) as residual patterns RP. The regions between the inorganic insulating layer ISL and the pixel electrodes (AE1, AE2, and AE3) may be filled with the residual patterns RP and the light-emitting layers (EL1, EL2, and EL3).

The common electrodes (CE1, CE2, and CE3) may be disposed on the light-emitting layers (EL1, EL2, and EL3). The common electrodes (CE1, CE2, and CE3) may include a transparent conductive material and may thus output light generated by the light-emitting layers (EL1, EL2, and EL3). The common electrodes (CE1, CE2, and CE3) may receive a common voltage or a low-potential voltage. As the pixel electrodes (AE1, AE2, and AE3) receive a voltage corresponding to a data voltage and the common electrodes (CE1, CE2, and CE3) receive a low-potential voltage, the difference in electric potential is formed between the pixel electrodes (AE1, AE2, and AE3) and the common electrodes (CE1, CE2, and CE3), and as a result, the light-emitting layers (EL1, EL2, and EL3) may emit light.

The common electrodes (CE1, CE2, and CE3) may include low work function material layers including Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg). The common electrodes (CE1, CE2, and CE3)

may further include transparent metal oxide layers, which are disposed on the low work function material layers.

The common electrodes (CE1, CE2, and CE3) may include first, second, and third common electrodes CE1, CE2, and CE3, which are disposed in different emission areas (EA1, EA2, and EA3). The first common electrode CE1 may be disposed on the first light-emitting layer EL1, in the first emission area EA1, the second common electrode CE2 may be disposed on the second light-emitting layer EL2, in the second emission area EA2, and the third common electrode CE3 may be disposed on the third light-emitting layer EL3, in the third emission area EA3.

Parts of the common electrodes (CE1, CE2, and CE3) of the light-emitting elements (ED1, ED2, and ED3) may be disposed on the side surfaces of the third bank layer BN3 of the bank structure BNS. The common electrodes (CE1, CE2, and CE3), like the light-emitting layers (EL1, EL2, and EL3), may be formed by deposition. Deposition processes for forming the common electrodes (CE1, CE2, and CE3) may be performed such that an electrode material for forming the common electrodes (CE1, CE2, and CE3) may be deposited diagonally, rather than perpendicularly, with respect to the top surface of the substrate SUB. Accordingly, the common electrodes (CE1, CE2, and CE3) may be disposed on the side surfaces of the third bank layer BN3, below the tips TIP of the second bank layer BN2 of the bank structure BNS. The common electrodes (CE1, CE2, and CE3) may be in direct contact with the side surfaces of the third bank layer BN3. The common electrodes (CE1, CE2, and CE3) of different light-emitting elements (ED1, ED2, and ED3) may be in direct contact with the third bank layer BN3 of the bank structure BNS and may be electrically connected to one another. The common electrodes (CE1, CE2, and CE3), unlike the pixel electrodes (AE1, AE2, and AE3), may not be separate between multiple pixels, but may be in common electrically for all pixels.

The contact areas of the common electrodes (CE1, CE2, and CE3) and the side surfaces of the third bank layer BN3 may be greater than the contact areas of the light-emitting layers (EL1, EL2, and EL3) and the side surfaces of the third bank layer BN3. The material of the common electrodes (CE1, CE2, and CE3) and the material of the light-emitting layers (EL1, EL2, and EL3) may be deposited diagonally, rather than perpendicularly, with respect to the top surface of the substrate SUB, and the contact areas of the common electrodes (CE1, CE2, and CE3) and the side surfaces of the third bank layer BN3 and the contact areas of the light-emitting layers (EL1, EL2, and EL3) and the side surfaces of the third bank layer BN3 may vary depending on the inclinations at which the material of the common electrodes (CE1, CE2, and CE3) and the material of the light-emitting layers (EL1, EL2, and EL3) are deposited. The material of the common electrodes (CE1, CE2, and CE3) may be deposited at a greater inclination than the material of the light-emitting layers (EL1, EL2, and EL3). The common electrodes (CE1, CE2, and CE3) may be deposited over larger areas of the sidewalls of the openings (OPE1, OPE2, and OPE3) and to greater heights in the openings (OPE1, OPE2, and OPE3) than the light-emitting layers (EL1, EL2, and EL3). As the common electrodes (CE1, CE2, and CE3) of different light-emitting elements (ED1, ED2, and ED3) are electrically connected via the third bank layer BN3, the common electrodes (CE1, CE2, and CE3) may preferably be in contact with a relatively large area of the third bank layer BN3.

A capping layer CPL may be disposed on the common electrodes (CE1, CE2, and CE3). The capping layer CPL may include an inorganic insulating material and may cover the light-emitting elements (ED1, ED2, and ED3) and patterns on the bank structure BNS. The capping layer CPL may prevent the light-emitting elements (ED1, ED2, and ED3) from being damaged by external air, and may prevent the patterns on the bank structure BNS from being peeled off during the fabrication of the display device 10. The capping layer CPL may include aluminum oxide, titanium oxide, tantalum oxide, hafnium oxide, zinc oxide, silicon oxide, silicon nitride, and/or silicon oxynitride.

During the fabrication of the display device 10, the light-emitting layers (EL1, EL2, and EL3) and the common electrodes (CE1, CE2, and CE3) of the light-emitting elements (ED1, ED2, and ED3), and the capping layer CPL may be formed by deposition processes. As the bank structure BNS includes the tips TIP, which are disposed in the second bank layer BN2, layers that are separate between different openings (OPE1, OPE2, and OPE3) can be formed by performing deposition on the entire surface of the display area DA of the display panel 100 without using a mask. First, second, and third inorganic layers TL1, TL2, and TL3, which are formed after the formation of the common electrodes (CE1, CE2, and CE3), may be disposed to cover the periphery of the emission areas (EA1, EA2, and EA3), on the bank structure BNS, and patterns including the same materials as the light-emitting layers (EL1, EL2, and EL3), the common electrodes (CE1, CE2, and CE3), and the capping layer CPL may remain on the bank structure BNS.

The display device 10 may include first, second, and third organic patterns ELP1, ELP2, and ELP3, first, second, and third electrode patterns CEP1, CEP2, and CEP3, and a capping pattern CLP.

A plurality of organic patterns (ELP1, ELP2, and ELP3) may be disposed on the second bank layer BN2. The organic patterns (ELP1, ELP2, and ELP3) may include the first, second, and third organic patterns ELP1, ELP2, and ELP3, which include the same material as the light-emitting layers (EL1, EL2, and EL3) of the light-emitting elements (ED1, ED2, and ED3).

The first organic pattern ELP1 may include the same material as the first light-emitting layer EL1 of the first light-emitting element ED1. The second organic pattern ELP2 may include the same material as the second light-emitting layer EL2 of the second light-emitting element ED2. The third organic pattern ELP3 may include the same material as the third light-emitting layer EL3 of the third light-emitting element ED3. The organic patterns (ELP1, ELP2, and ELP3) may be formed by the same processes as the light-emitting layer (EL1, EL2, and EL3). The organic patterns (ELP1, ELP2, and ELP3) may be disposed near the emission areas (EA1, EA2, and EA3), in which the light-emitting layers (EL1, EL2, and EL3) are disposed. In an embodiment, for example, the first organic pattern ELP1 may surround the first opening OPE1, near the first emission area EA1 or the first opening OPE1, and may be disposed on the second bank layer BN2. In an embodiment, for example, the second organic pattern ELP2 may surround the second opening OPE2, near the second emission area EA2 or the second opening OPE2, and may be disposed on the second bank layer BN2. In an embodiment, for example, the third organic pattern ELP3 may surround the third opening OPE3, near the third emission area EA3 or the third opening OPE3, and may be disposed on the second bank layer BN2.

As the bank structure BNS includes the tips TIP, the organic patterns (ELP1, ELP2, and ELP3) may be traces of the deposited material for forming the light-emitting layers (EL1, EL2, and EL3) that are disconnected from the light-emitting layers (EL1, EL2, and EL3) by the tips TIP of the bank structure BNS. The light-emitting layers (EL1, EL2, and EL3) may be disposed in the openings (OPE1, OPE2, and OPE3) and may be disconnected from the organic patterns (ELP1, ELP2, and ELP3) by the tips TIP of the bank structure BNS. As the light-emitting layers (EL1, EL2, and EL3) are formed by deposition without using a mask, the material of the light-emitting layers (EL1, EL2, and EL3) may be initially deposited on the entire bank structure BNS and may then be patterned around the emission areas (EA1, EA2, and EA3) or the openings (OPE1, OPE2, and OPE3), thereby obtaining the organic patterns (ELP1, ELP2, and ELP3).

A plurality of electrode patterns (CEP1, CEP2, and CEP3) may be disposed on the organic patterns (ELP1, ELP2, and ELP3). The electrode patterns (CEP1, CEP2, and CEP3) may include the first, second, and third electrode patterns CEP1, CEP2, and CEP3, which include the same material as the common electrodes (CE1, CE2, and CE3) of the light-emitting elements (ED1, ED2, and ED3).

In an embodiment, for example, the first, second, and third electrode patterns CEP1, CEP2, and CEP3 may be disposed directly on the first, second, and third organic patterns ELP1, ELP2, and ELP3, respectively. The relationship between the electrode patterns (CEP1, CEP2, and CEP3) and the organic patterns (ELP1, ELP2, and ELP3) may be the same as the relationship between the common electrodes (CE1, CE2, and CE3) and the light-emitting layers (EL1, EL2, and EL3) of the light-emitting elements (ED1, ED2, and ED3). The electrode patterns (CEP1, CEP2, and CEP3) may be traces of the deposited material for forming the common electrodes (CE1, CE2, and CE3) that are disconnected from the common electrodes (CE1, CE2, and CE3) by the tips TIP of the bank structure BNS. Due to the presence of the tips TIP of the bank structure BNS, the common electrodes (CE1, CE2, and CE3) can be formed separately in different areas even by a deposition process not using a mask.

The capping pattern CLP may be disposed on the electrode patterns (CEP1, CEP2, and CEP3). The capping pattern CLP may include the same material as the capping layer CPL on the common electrodes (CE1, CE2, and CE3). The capping pattern CLP may be disposed directly on the first, second, and third electrode patterns CEP1, CEP2, and CEP3. The relationship between the capping pattern CLP and the electrode patterns (CEP1, CEP2, and CEP3) may be the same as the relationship between the capping layer CPL and the common electrodes (CE1, CE2, and CE3) of the light-emitting elements (ED1, ED2, and ED3). The capping pattern CLP may be a trace of the deposited material for forming the capping layer CPL that is disconnected from the capping layer CPL by the tips TIP of the bank structure BNS.

The organic patterns (ELP1, ELP2, and ELP3), the electrode patterns (CEP1, CEP2, and CEP3), and the capping pattern CLP may be disposed on the bank structure BNS to surround the emission areas (EA1, EA2, and EA3) or the openings (OPE1, OPE2, and OPE3). During the fabrication of the display device 10, stacks of the organic patterns (ELP1, ELP2, and ELP3), the electrode patterns (CEP1, CEP2, and CEP3), and the capping pattern CLP may be partially etched around the emission areas (EA1, EA2, and EA3), and as a result, the shape of the stacks of the organic patterns (ELP1, ELP2, and ELP3), the electrode patterns (CEP1, CEP2, and CEP3), and the capping pattern CLP may change. Accordingly, parts of the top surface of the second bank layer BN2 of the bank structure BNS may not be covered by the organic patterns (ELP1, ELP2, and ELP3), the electrode patterns (CEP1, CEP2, and CEP3), and the capping pattern CLP, and trenches TP may be disposed on the corresponding parts of the top surface of the second bank layer BN2 of the bank structure BNS.

The thin-film encapsulation layer TFEL may be disposed on the light-emitting elements (ED1, ED2, and ED3) and the bank structure BNS and may cover the light-emitting elements (ED1, ED2, and ED3) and the bank structure BNS. The thin-film encapsulation layer TFEL may include at least one inorganic film and may prevent the infiltration of oxygen or moisture into the light-emitting element layer EML. The thin film-encapsulation layer TFEL may also include at least one organic film and may protect the light-emitting element layer EML from a foreign material such as dust.

The thin film-encapsulation layer TFEL may include first, second, and third encapsulation layers TFE1, TFE2, and TFE3, which are sequentially stacked. The first and third encapsulation layers TFE1 and TFE3 may be inorganic encapsulation layers, and the second encapsulation layer TFE2, which is disposed between the first and third encapsulation layers TFE1 and TFE3, may be an organic encapsulation layer.

The first and third encapsulation layers TFE1 and TFE3 may include an inorganic insulating material. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer material. The polymer material may include an acrylic resin, an epoxy resin, polyimide, or polyethylene. The second encapsulation layer TFE2 may include an acrylic resin, for example, polymethyl methacrylate or poly-acrylic acid. The second encapsulation layer TFE2 may be formed by curing a monomer or applying a polymer.

The first encapsulation layer TFE1 may be disposed on the light-emitting elements (ED1, ED2, and ED3), on the patterns on the bank structure BNS, and on the bank structure BNS. The first encapsulation layer TFE1 may include the first, second, and third inorganic layers TL1, TL2, and TL3, which are disposed to correspond to different emission areas (EA1, EA2, and EA3).

The first, second, and third inorganic layers TL1, TL2, and TL3 may include an inorganic insulating material and may cover the light-emitting elements (ED1, ED2, and ED3). The first, second, and third inorganic layers TL1, TL2, and TL3 may prevent the light-emitting elements (ED1, ED2, and ED3) from being damaged by external air and may prevent the patterns on the bank structure BNS from being peeled off during the fabrication of the display device 10. The first, second, and third inorganic layers TL1, TL2, and TL3 may include aluminum oxide, titanium oxide, tantalum oxide, hafnium oxide, zinc oxide, silicon oxide, silicon nitride, and/or silicon oxynitride.

The first, second, and third inorganic layers TL1, TL2, and TL3 may be disposed on the bank structure BNS and may be disposed to cover the light-emitting elements (ED1, ED2, and ED3), in the emission areas (EA1, EA2, and EA3) or the openings (OPE1, OPE2, and OPE3) of the bank structure BNS. The first, second, and third inorganic layers TL1, TL2, and TL3 may be disposed directly on the capping layer CPL, in the openings (OPE1, OPE2, and OPE3) of the bank structure BNS. The first, second, and third inorganic layers TL1, TL2, and TL3 may be formed by chemical vapor deposition ("CVD") to have a uniform thickness along the underlying step differences. In an embodiment, for example, the first, second, and third inorganic layers TL1, TL2, and TL3 may form thin films below the undercuts formed by the tips TIP of the bank structure BNS.

The first, second, and third inorganic layers TL1, TL2, and TL3 are illustrated as being disposed on the same layer, but may be formed by different processes of the fabrication of the display device 10. In an embodiment, for example, the light-emitting layers (EL1, EL2, and EL3) of the light-emitting elements (ED1, ED2, and ED3) may be formed not at the same time, but by different processes. Similarly, the first, second, and third inorganic layers TL1, TL2, and TL3 may be formed by different processes. The first inorganic layer TL1 may be formed after the formation of the first common electrode CE1, the second inorganic layer TL2 may be formed after the second common electrode CE2, and the third inorganic layer TL3 may be formed after the formation of the third common electrode CE3. That is, the first inorganic layer TL1 may be formed earlier than the second and third light-emitting elements ED2 and ED3, and the second inorganic layer TL2 may be formed earlier than the third light-emitting element ED3.

The first, second, and third inorganic layers TL1, TL2, and TL3 may be disposed in part on the bank structure BNS, around the emission areas (EA1, EA2, and EA3). The inorganic layers TL1, TL2, and TL3 may be initially formed to completely cover the bank structure BNS and may then be partially patterned later.

The first inorganic layer TL1 may be disposed on the first light-emitting element ED1. The first inorganic layer TL1 may be disposed to cover the first light-emitting element ED1 and the inner sidewall of the first opening OPE1. The first inorganic layer TL1 may also be disposed on the bank structure BNS to cover the first organic pattern ELP1, the first electrode pattern CEP1, and the capping pattern CLP, around the first opening OPE1.

The second inorganic layer TL2 may be disposed on the second light-emitting element ED2. The second inorganic layer TL2 may be disposed to cover the second light-emitting element ED2 and the inner sidewall of the second opening OPE2. The second inorganic layer TL2 may also be disposed on the bank structure BNS to cover the first organic pattern ELP1, the first electrode pattern CEP1, and the capping pattern CLP, around the second opening OPE2.

The third inorganic layer TL3 may be disposed on the third light-emitting element ED3. The third inorganic layer TL3 may be disposed to cover the third light-emitting element ED3 and the inner sidewall of the third opening OPE3. The third inorganic layer TL3 may also be disposed on the bank structure BNS to cover the first organic pattern ELP1, the first electrode pattern CEP1, and the capping pattern CLP, around the third opening OPE3.

In a plan view, the first, second, and third inorganic layers TL1, TL2, and TL3 may be disposed on the bank structure BNS to be spaced apart from one another. Accordingly, parts of the second bank layer BN2 of the bank structure BNS that do not overlap with the first, second, and third inorganic layers TL1, TL2, and TL3 in a plan view may be exposed and may be in direct contact with the second encapsulation layer TFE2 of the thin-film encapsulation layer TFEL.

The touch sensing layer TSU may be disposed on the thin-film encapsulation layer TFEL. The touch sensing layer TSU may include a first touch insulating layer SIL1, a second touch insulating layer SIL2, touch electrodes TEL, and a third touch insulating layer SIL3.

The first touch insulating layer SIL1 may be disposed on the thin-film encapsulation layer TFEL. The first touch insulating layer SIL1 may have insulating and optical functions. The first touch insulating layer SIL1 may include at least one inorganic layer. The first touch insulating layer SIL1 may be optional.

The second touch insulating layer SIL2 may cover the first touch insulating layer SIL1. Although not specifically illustrated, other touch electrodes TEL may be disposed on the first touch insulating layer SIL1 and may be covered by the second touch insulating layer SIL2. The second touch insulating layer SIL2 may have insulating and optical functions. In an embodiment, for example, the second touch insulating layer SIL2 may be an inorganic film including at least one of a silicon nitride layer, a silicon oxy nitride layer, a silicon oxide layer, a titanium oxide layer, and an aluminum oxide layer.

Some of the touch electrodes TEL may be disposed on the second touch insulating layer SIL2. The touch electrodes TEL may not overlap with the first, second, and third emission areas EA1, EA2, and EA3 in a plan view. The touch electrodes TEL may be formed as single layers including Mo, Ti, Cu, Al, ITO, or an Ag—Pd—Cu ("APC") alloy or as stacks of Al and Ti (e.g., Ti/Al/Ti), Al and ITO (e.g., ITO/Al/ITO), and an APC alloy and ITO (e.g., ITO/APC/ITO).

The third touch insulating layer SIL3 may cover the touch electrodes TEL and the second touch insulating layer SIL2. The third touch insulating layer SIL3 may have insulating and optical functions. The third touch insulating layer SIL3 may be formed of or including any one of the aforementioned materials for forming the second touch insulating layer SIL2.

The antireflection layer RPL may be disposed on the touch sensing layer TSU. The antireflection layer RPL may include the light-blocking layer BM and the color filter layer CFL. The light-blocking layer BM may be disposed on the touch sensing layer TSU. The light-blocking layer BM may include the opening holes (OPT1, OPT2, and OPT3), which are disposed to overlap with the emission areas (EA1, EA2, and EA3) in a plan view. In an embodiment, for example, a first opening hole OPT1 may be disposed to overlap with the first emission area EA1, a second opening hole OPT2 may be disposed to overlap with the second emission area EA2, and a third opening hole OPT3 may be disposed to overlap with the third emission area EA3 in a plan view. The opening holes (OPT1, OPT2, and OPT3) may have a larger area or size than the emission areas (EA1, EA2, and EA3), which are defined by the bank structure BNS. As the opening holes (OPT1, OPT2, and OPT3) of the light-blocking layer BM are formed to be larger in size than the emission areas (EA1, EA2, and EA3), light emitted from the emission areas (EA1, EA2, and EA3) can be visible to the user not only at the front, but also at the sides of the display device 10.

The light-blocking layer BM may include a light-absorbing material. In an embodiment, for example, the light-blocking layer BM may include an inorganic black pigment or an organic black pigment. The inorganic black pigment may be, but is not limited to, carbon black, and the organic black pigment may include, but is not limited to, at least one of lactam black, perylene black, and aniline black. The light-blocking layer BM can prevent visible light from infiltrating between the first, second, and third emission areas EA1, EA2, and EA3 to cause color mixing and can thus improve the color reproducibility of the display device 10.

The color filters (CF1, CF2, and CF3) may be disposed in the emission areas (EA1, EA2, and EA3). The color filters (CF1, CF2, and CF3) may be disposed on the light-blocking layer BM, which includes the opening holes (OPT1, OPT2, and OPT3) that are disposed to correspond to the emission areas (EA1, EA2, and EA3). The opening holes (OPT1, OPT2, and OPT3) may be formed to overlap with the emission areas (EA1, EA2, and EA3) and the openings (OPE1, OPE2, and OPE3) of the bank structure BNS in a plan view and may form light-output areas that output light emitted by the emission areas (EA1, EA2, and EA3). The color filters (CF1, CF2, and CF3) may have a larger area than the opening holes (OPT1, OPT2, and OPT3) of the bank structure BNS and may completely cover the light-output areas formed by the opening holes (OPT1, OPT2, and OPT3).

The color filters (CF1, CF2, and CF3) may include first, second, and third color filters CF1, CF2, and CF3. The color filters (CF1, CF2, and CF3) may include a colorant such as a pigment or dye capable of absorbing all wavelengths of light except for a particular wavelength range and may be disposed to correspond to the colors of light emitted from the emission areas (EA1, EA2, and EA3). In an embodiment, for example, the first color filter CF1 may be disposed to overlap with the first emission area EA1 in a plan view and may be a red color filter capable of transmitting only red light therethrough, the second color filter CF2 may be disposed to overlap with the second emission area EA2 in a plan view and may be a green color filter capable of transmitting only green light therethrough, and the third color filter CF3 may be disposed to overlap with the third emission area EA3 in a plan view and may be a blue color filter capable of transmitting only blue light therethrough.

The color filters (CF1, CF2, and CF3) may be spaced apart from one another on the light-blocking layer BM. The color filters (CF1, CF2, and CF3) may have a larger area than the opening holes (OPT1, OPT2, and OPT3) of the light-blocking layer BM to cover the opening holes (OPT1, OPT2, and OPT3) of the light-blocking layer BM and to be spaced apart from one another on the light-blocking layer BM, but the disclosure is not limited thereto. The color filters (CF1, CF2, and CF3) may partially overlap with one another in a plan view. Different color filters (CF1, CF2, and CF3) may overlap with one another on the light-blocking layer BM in a plan view, which corresponds to an area not overlapping with the emission areas (EA1, EA2, and EA3) in a plan view. As the color filters (CF1, CF2, and CF3) are disposed to overlap with one another in a plan view, the intensity of reflected light of external light can be effectively reduced. Also, the color of reflected light of external light can be controlled by controlling the layout, the shape, and size of the color filters (CF1, CF2, and CF3).

The color filters (CF1, CF2, and CF3) of the color filter layer CFL may be disposed on the light-blocking layer BM. The color filters (CF1, CF2, and CF3) may be disposed to correspond to the emission areas (EA1, EA2, and EA3), the openings (OPE1, OPE2, and OPE3), and the opening holes (OPT1, OPT2, and OPT3). In an embodiment, for example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first opening hole OPT1 of the light-blocking layer BM, the second color filter CF2 may be disposed in the second opening hole OPT2 of the light-blocking layer BM, and the third color filter CF3 may be disposed in the third opening hole OPT3 of the light-blocking layer BM. The color filters (CF1, CF2, and CF3) may have a larger area than the opening holes (OPT1, OPT2, and OPT3) of the light-blocking layer BM, and parts of the color filters (CF1, CF2, and CF3) may be disposed directly on the light-blocking layer BM.

An overcoat layer OC may be disposed on the color filters (CF1, CF2, and CF3) may be disposed on the color filters (CF1, CF2, and CF3) and may planarize the tops of the color filters (CF1, CF2, and CF3). The overcoat layer OC may be a colorless light-transmitting layer not having a color in a visible wavelength range. In an embodiment, for example, the overcoat layer OC may include a colorless light-transmitting organic material such as an acrylic resin.

The fabrication of the display device 10 will hereinafter be described.

FIGS. 9 through 16 are cross-sectional views illustrating a method of fabricating a display device according to an embodiment of the disclosure.

FIGS. 9 through 16 illustrate how to form a bank structure BNS and light-emitting elements (ED1, ED2, and ED3) of a light-emitting element layer EML. A detailed description of how to form each of the layers of the display device 10 will be omitted, and instead, the order in which the layers of the display device 10 are formed will hereinafter be described.

Figure 9:
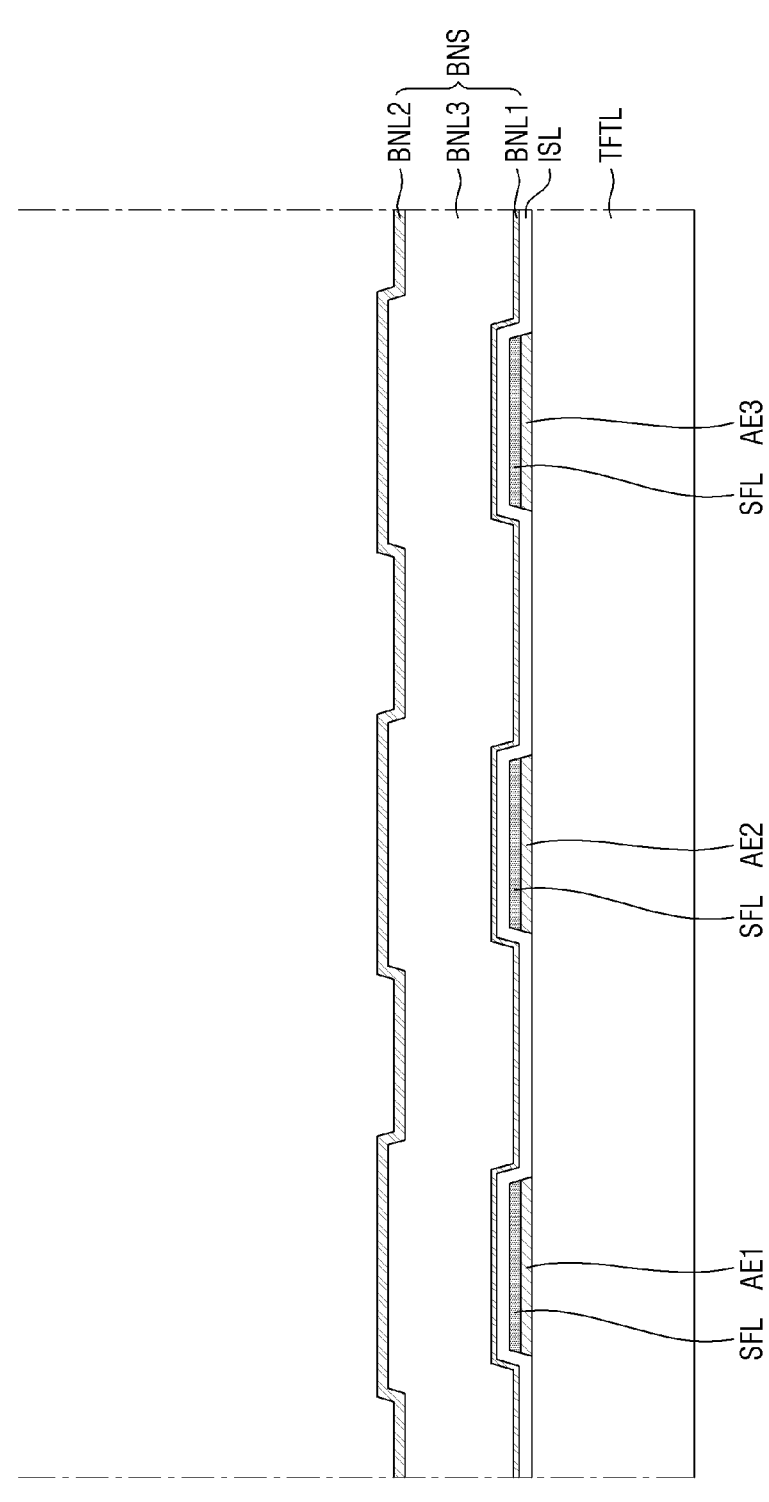

Referring to FIG. 9, a plurality of pixel electrodes (AE1, AE2, and AE3), a sacrificial layer SFL, an inorganic insulating layer ISL, and first, second, and third bank material layers BNL1, BNL2, and BNL3 are formed.

Although not specifically illustrated, a TFT layer TFTL may be disposed on a substrate SUB. The structure of the TFT layer TFTL is as described above with reference to FIG. 6, and thus, a detailed description thereof will be omitted.

The pixel electrodes (AE1, AE2, and AE3) may be spaced apart from one another on the TFT layer TFTL. The pixel electrodes (AE1, AE2, and AE3) may include first, second, and third pixel electrodes AE1, AE2, and AE3, which are of first, second, and third light-emitting elements ED1, ED2, and ED3, respectively. The first, second, and third pixel electrodes AE1, AE2, and AE3 may be spaced apart from one another on the TFT layer TFTL.

The sacrificial layer SFL may be disposed on the pixel electrodes (AE1, AE2, and AE3). The sacrificial layer SFL may be initially disposed on the pixel electrodes (AE1, AE2, and AE3) and may then be removed to provide spaces in which to arrange light-emitting layers (EL1, EL2, and EL3). The sacrificial layer SFL may allow the inorganic insulating layer ISL not to be in contact with the top surfaces of the pixel electrodes (AE1, AE2, and AE3). The sacrificial layer SFL may include an oxide semiconductor. In an embodiment, for example, the sacrificial layer SFL may include at least one of indium gallium zinc oxide ("IGZO"), zinc tin oxide ("ZTO"), and indium tin oxide (ITO).

The inorganic insulating layer ISL and the first, second, and third bank material layers BNL1, BNL2, and BNL3 may be disposed on the sacrificial layer SFL. The inorganic insulating layer ISL may be disposed to cover all the sacrificial layer SFL and the entire TFT layer TFTL, and the first, second, and third bank material layers BNL1, BNL2, and BNL3 may be disposed to cover the entire inorganic insulating layer ISL. The third bank material layer BNL3 may be disposed between the first and second bank material layers BNL1 and BNL2. The first bank material layer BNL1 may be disposed directly on the inorganic insulating layer ISL, and the third bank material layer BNL3 and the second bank material layer BNL2 may be sequentially disposed on the first bank material layer BNL1. The first, second, and third bank material layers BNL1, BNL2, and BNL3 may be partially etched in a subsequent process, thereby forming first, second, and third second bank layers BN1, BN2, and BN3 of the bank structure BNS. The first and second bank material layers BNL1 and BNL2 may include the same material, and the third bank material layer BNL3 may include a different metal material from the first and second bank material layers BNL1 and BNL2. The first, second, and third bank material layers BNL1, BNL2, and BNL3 may be substantially the same as the first, second, and third bank layers BN1, BN2, and BN3, respectively, and thus, detailed descriptions thereof will be omitted.

Figure 10:
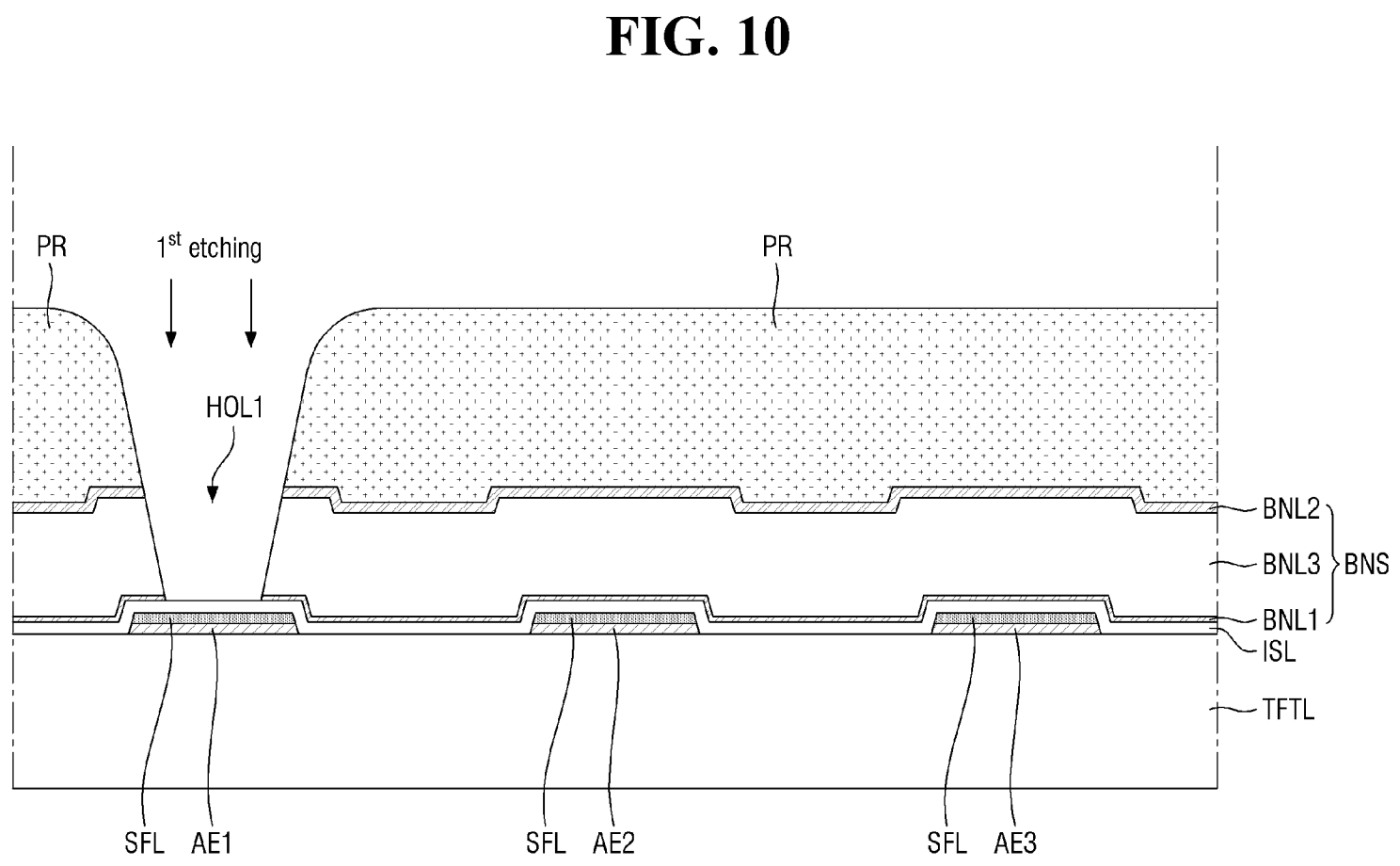

Thereafter, referring to FIG. 10, photoresist PR is formed on the first, second, and third bank material layers BNL1, BNL2, and BNL3, and a first etching process "1$^{st}$ etching", which etches parts of the first, second, and third bank material layers BNL1, BNL2, and BNL3, is performed using the photoresist PR as a mask, thereby forming a first hole HOL1.

The photoresist PR may be disposed on the first, second, and third bank material layers BNL1, BNL2, and BNL3 and may include patterns that are spaced apart from one another. The photoresist PR may not overlap with the first pixel electrode AE1 in a plan view, on the second bank material layer BNL2, and may expose parts of the first, second, and third bank material layers BNL1, BNL2, and BNL3 that overlap with the first pixel electrode AE1 in a plan view.

Dry etching may be performed as the first etching process "1$^{st}$ etching". As dry etching is performed as the first etching process "1$^{st}$ etching", the first, second, and third bank material layers BNL1, BNL2, and BNL3, which include different materials, may be anisotropically etched. As the first, second, and third bank material layers BNL1, BNL2, and BNL3 and the inorganic insulating layer ISL are partially etched together, the sacrificial layer SFL may be partially exposed. The first hole HOL1 may be defined in an area overlapping with the first pixel electrode AE1 in a plan view and may form a first opening OPE1 of the bank structure BNS.

Figure 11:
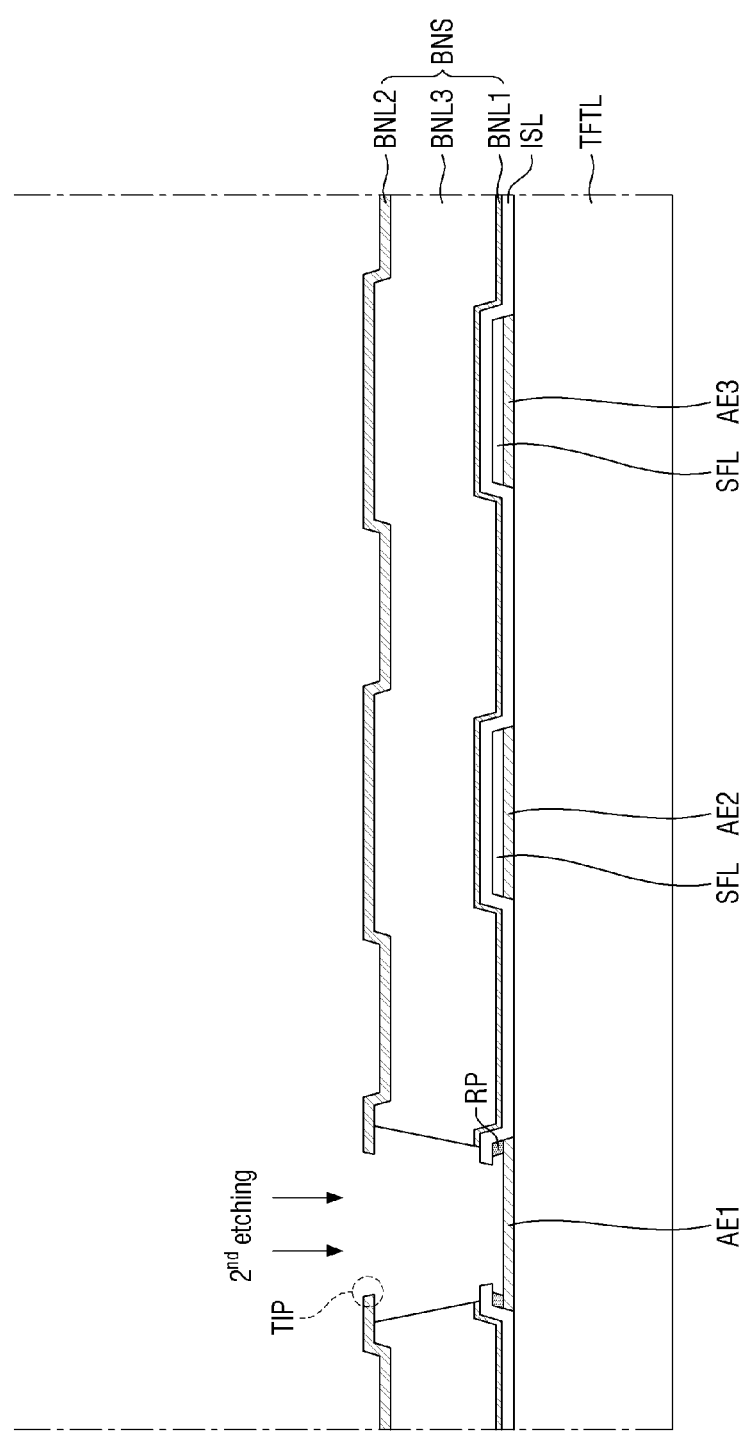

Thereafter, referring to FIG. 11, a second etching process "2"d etching", which removes part of the sacrificial layer SFL on the first pixel electrode AE1, is performed. The sacrificial layer SFL may include an oxide semiconductor layer, and wet-etching may be performed as the second etching process "2$^{nd}$ etching". As the sacrificial layer SFL is removed by the second etching process "2$^{nd}$ etching", the inner sidewall of the first hole HOL1 may be etched. The third bank material layer BNL3 may be etched faster than the first and second bank material layers BNL1 and BNL2, and tips TIP, which protrude beyond the side surfaces of the third bank material layer BNL3, may be formed in the second bank material layer BNL2. Undercuts may be formed on the side surfaces of the third bank material layer BNL3, below the tips TIP of the second bank material layer BNL2. The first bank material layer BNL1 may be etched faster than the second bank material layer BNL2 and may thus neither protrude beyond the side surfaces of the third bank material layer BNL3 nor form tips. As a result of the second etching process "2$^{nd}$ etching", the first hole HOL1 may form the first opening OPE1 or a first emission area EA1.

The sacrificial layer SFL may be partially removed from the first hole HOL1 and from between the inorganic insulating layer ISL and the first pixel electrode AE1. The sacrificial layer SFL may not be completely removed but may remain between the inorganic insulating layer ISL and the first pixel electrode AE1 as a residual pattern RP. As the sacrificial layer SFL is removed, a gap may be formed between the first pixel electrode AE1 and the inorganic insulating layer ISL, and a first light-emitting layer EL1 may be formed later on the first pixel electrode AE1 to fill the gap.

Figure 12:
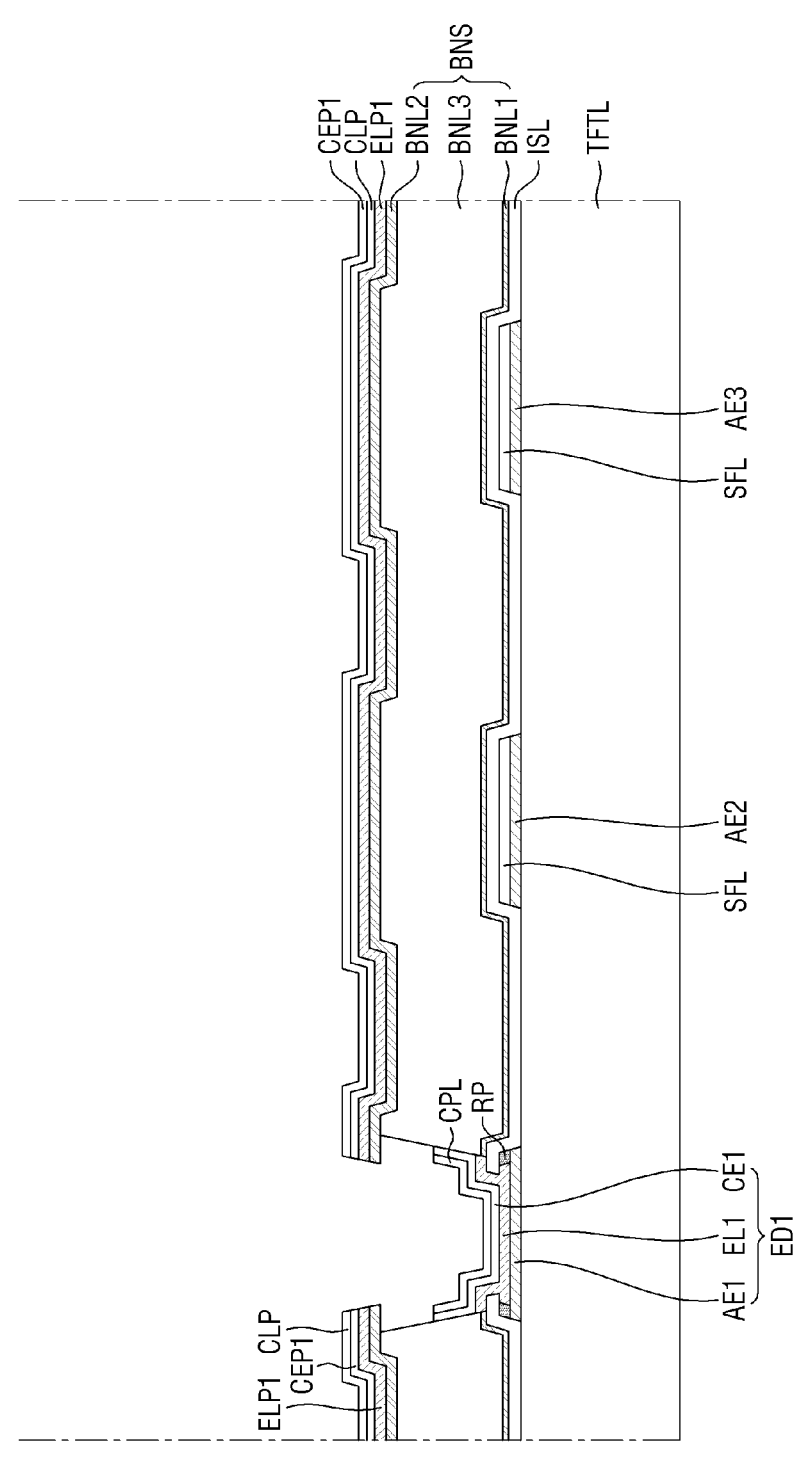

Thereafter, referring to FIG. 12, the first light-emitting layer EL1, a first common electrode CE1, and a capping layer CPL are deposited on the first pixel electrode AE1, thereby forming a first light-emitting element ED1. The first light-emitting layer EL1 and the first common electrode CE1 may be formed in the first opening OPE1, and the materials of the first light-emitting layer EL1 and the first common electrode CE1 may also be deposited even on the second bank material layer BNL2, thereby forming a plurality of patterns. In an embodiment, for example, some of the materials of the first light-emitting layer EL1 and the first common electrode CE1 may be deposited on the second bank material layer BNL2, thereby forming a first organic pattern ELP1 and a first electrode pattern CEP1. Part of the capping layer CPL may be disposed in the first opening OPE1 to cover the first light-emitting element ED1, and another part of the capping layer CPL may be disposed on the second bank material layer BNL2 to cover the first organic pattern ELP1 and the first electrode pattern CEP1. The structures of the first light-emitting layer EL1, the first common electrode CE1, the first organic pattern ELP1, and the first electrode pattern CEP1 are as already described above.

The first light-emitting layer EL1 and the first common electrode CE1 may be formed by deposition. The materials of the first light-emitting layer EL1 and the first common electrode CE1 may not be properly deposited due to the tips TIP of the second bank material layer BNL2. However, as the materials of the first light-emitting layer EL1 and the first common electrode CE1 are deposited diagonally, rather than perpendicularly, with respect to the top surface of the substrate SUB, the materials of the first light-emitting layer EL1 and the first common electrode CE1 can be deposited even in regions on the third bank material layer BNL3 that are hidden by the tips TIP.

In an embodiment, for example, a deposition process for forming the first light-emitting layer EL1 may be performed in a direction not perpendicular to the top surface of the first pixel electrode AE1, for example, at a first angle with respect to the top surface of the first pixel electrode AE1. The material of light-emitting layers (EL1, EL2, and EL3) may be deposited at an angle of 45° to 50° with respect to the top surfaces of the pixel electrodes (AE1, AE2, and AE3). The first light-emitting layer EL1 may be formed to fill the space between the first pixel electrode AE1 and the inorganic insulating layer ISL and may be formed even in regions hidden by the tips TIP of the second bank material layer BNL2. In an embodiment, for example, the first light-emitting layer EL1 may be disposed on parts of the side surfaces of the third bank material layer BNL3, hidden by the tips TIP of the second bank material layer BNL2.

A deposition process for forming the first common electrode CE1 may be performed in a direction not perpendicular to the top surface of the first pixel electrode AE1, for example, at a second angle with respect to the top surface of the first pixel electrode AE1. The material of common electrodes (CE1, CE2, and CE3) may be deposited at an angle of 30° or less with respect to the top surfaces of the pixel electrodes (AE1, AE2, and AE3). The first common electrode CE1 may be disposed on the first light-emitting layer EL1 and may be formed even in regions hidden by the tips TIP of the second bank material layer BNL2. In an embodiment, for example, the first common electrode CE1 may be disposed on parts of the side surfaces of the third bank material layer BNL3, hidden by the tips TIP of the second bank material layer BNL2.

Deposition processes for forming the light-emitting layers (EL1, EL2, and EL3) may be performed more horizontally than deposition processes for forming the common electrodes (CE1, CE2, and CE3). As a result, the contact areas of the common electrodes (CE1, CE2, and CE3) and the third bank material layer BNL3 (or the side surfaces of the third bank material layer BNL3) may be greater than the contact areas of the light-emitting layers (EL1, EL2, and EL3) and the first bank material layer BNL1 (or the side surfaces of the third bank material layer BNL3). Alternatively, the common electrodes (CE1, CE2, and CE3) may be deposited to a greater height than the light-emitting layers (EL1, EL2, and EL3), on the third bank material layer BNL3 (or the side surfaces of the third bank material layer BNL3). Different common electrodes (CE1, CE2, and CE3) may be in contact with the third bank material layer BNL3 or the third bank layer BN3, which has a high conductivity, and may thus be electrically connected to one another.

Figure 13:
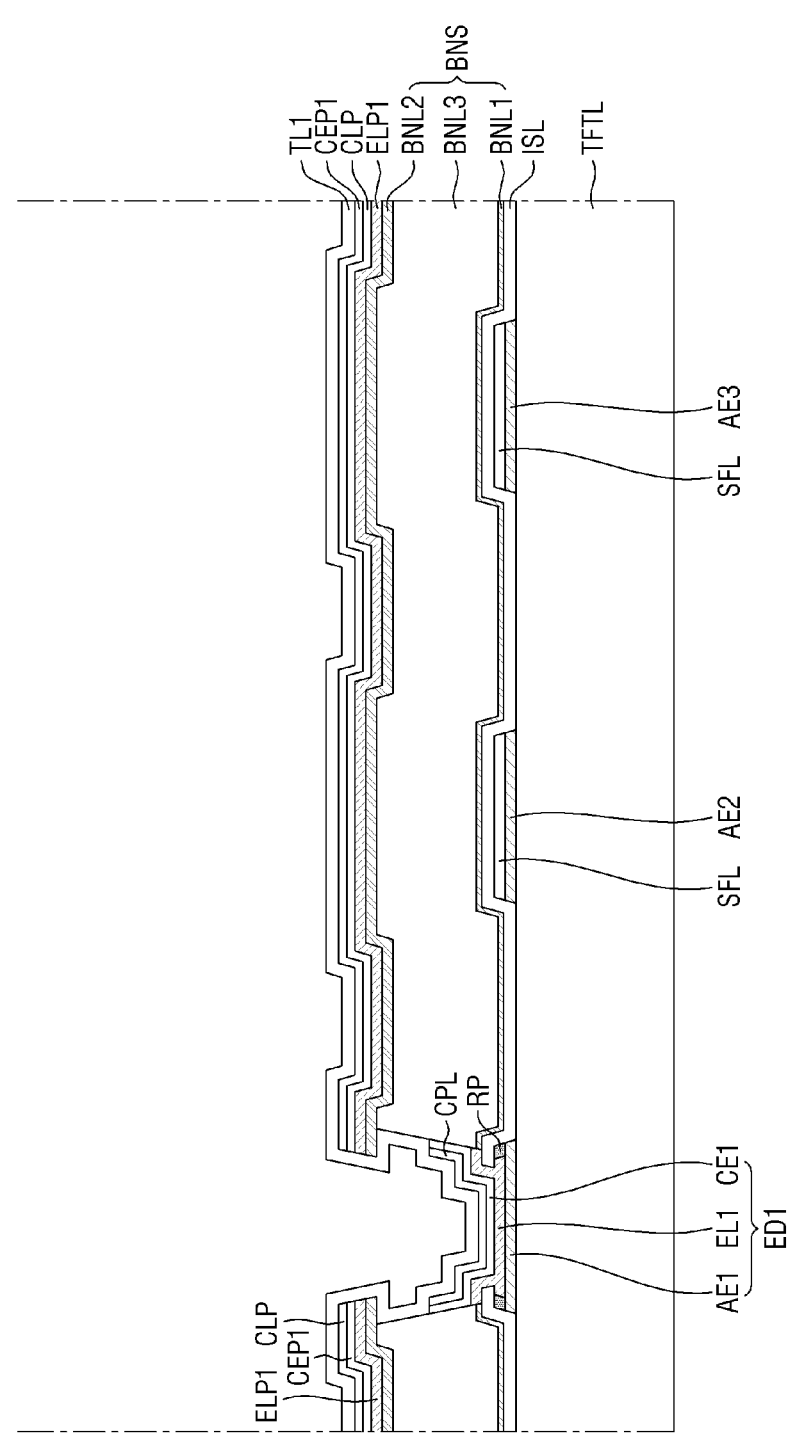

Thereafter, referring to FIG. 13, a first inorganic layer TL1, which covers the first light-emitting element ED1 and the capping layer CPL, is formed. The first inorganic layer TL1, unlike the light-emitting layers (EL1, EL2, and EL3) and the common electrodes (CE1, CE2, and CE3), may be formed by CVD and may have a uniform thickness regardless of the underlying step differences. The first inorganic layer TL1 may be formed to completely cover the first light-emitting element ED1, the first, second, and third bank material layers BNL1, BNL2, and BNL3, and the capping layer CPL. The first inorganic layer TL1 may be deposited even below the tips TIP of the second bank material layer BNL2.

Figure 14:
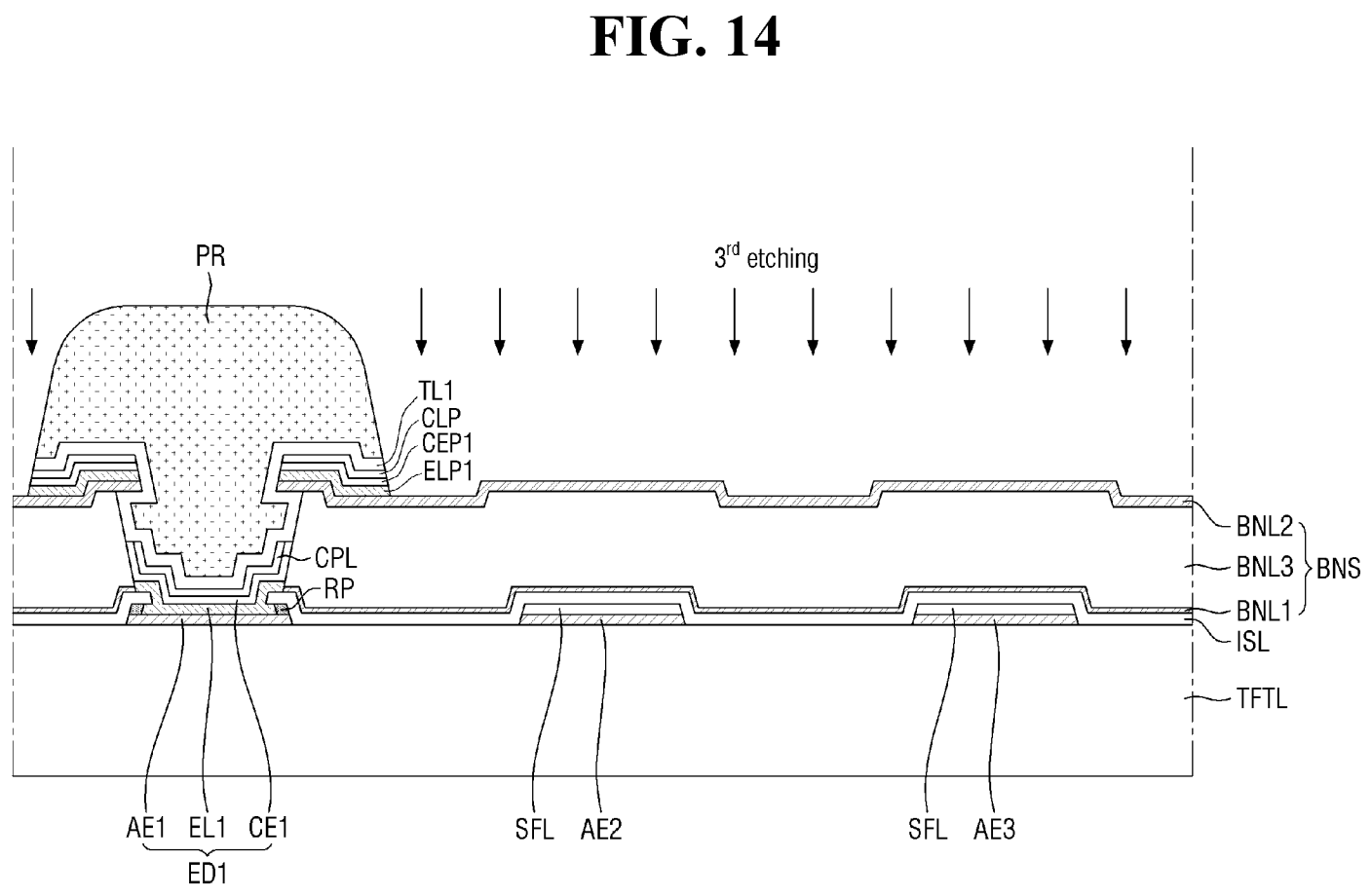

Thereafter, referring to FIG. 14, photoresist PR is formed on the first inorganic layer TL1, and a third etching process "3$^{rd}$ etching", which removes parts of the first organic pattern ELP1, the first electrode pattern CEP1, the capping layer CPL, and the first inorganic layer TL1 on the first, second, and third bank material layers BNL1, BNL2, and BNL3, is performed.

The photoresist PR may be disposed to overlap with the first opening OPE1 or the first light-emitting element ED1 in a plan view. The entire first organic pattern ELP1, the entire first electrode pattern CEP1, an entire capping pattern CLP, and the entire first inorganic layer TL1 except for parts thereof around the first opening OPE1 or the first light-emitting element ED1 may be removed. The entire second bank material layer BNL2 except for part thereof around the first opening OPE1 or the first light-emitting element ED1 may be exposed. Dry etching using a fluorine (F)-based etchant may be performed as the third etching process "3rd etching", which removes part of the first inorganic layer TL1 on the first, second, and third bank material layers BNL1, BNL2, and BNL3.

In this manner, a first light-emitting element ED1 and a first inorganic layer TL1 covering the first light-emitting element ED1, the first organic pattern ELP1, the first electrode pattern CEP1, and the capping layer CPL may be obtained.

Figure 15:
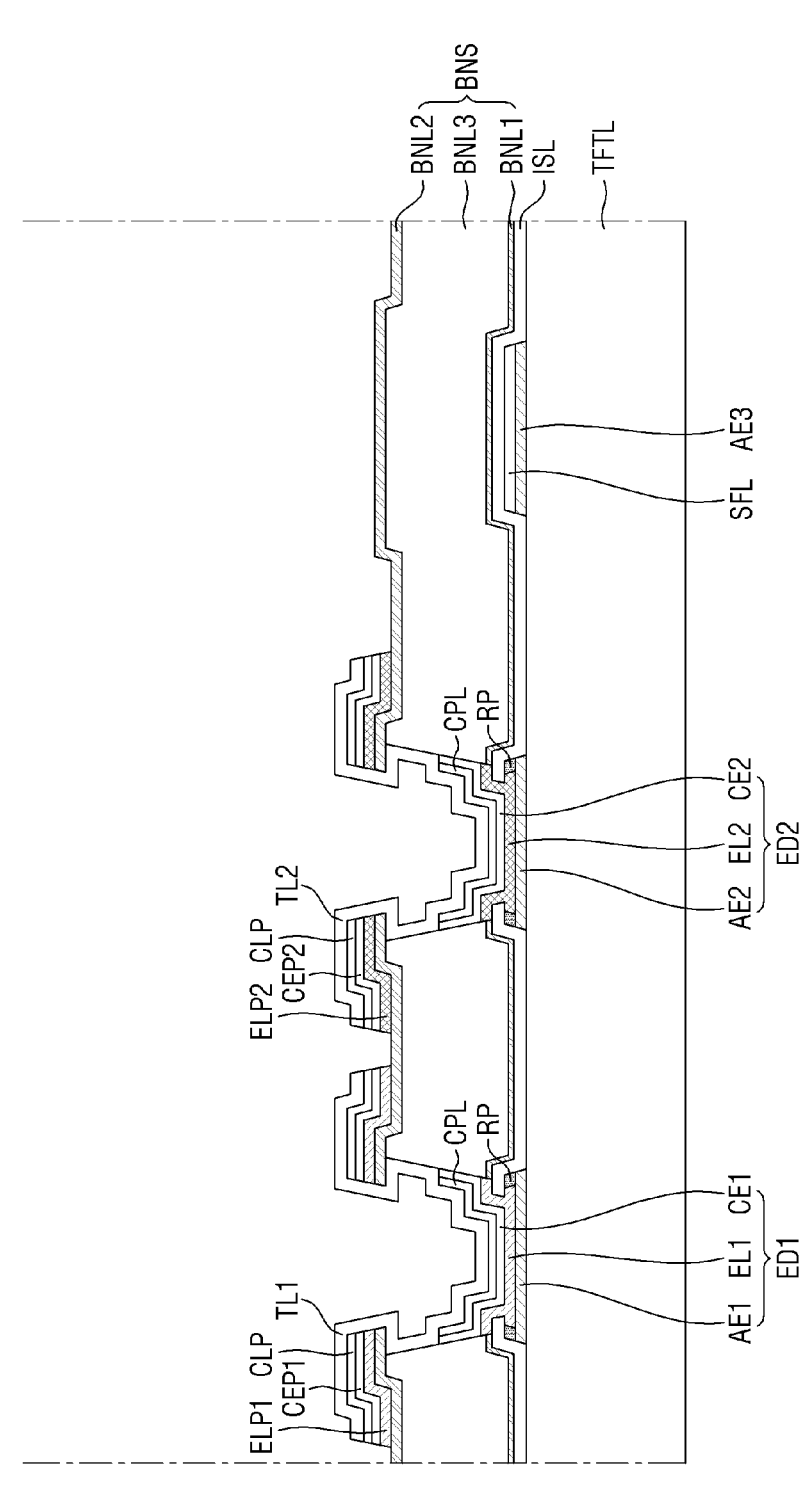
Figure 16:
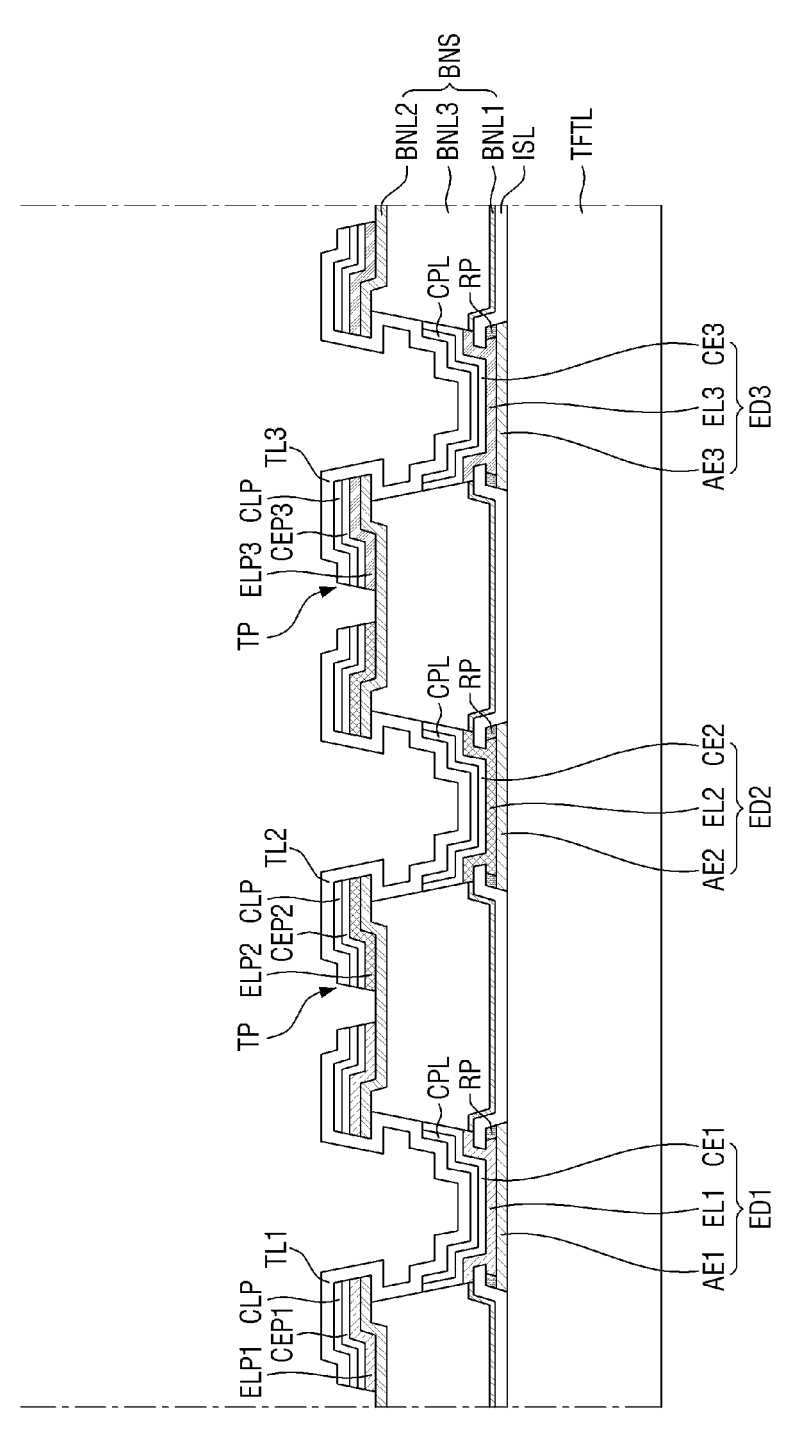

Referring to FIGS. 15 and 16, a second light-emitting element ED2, a third light-emitting element ED3, a second inorganic layer TL2, and a third inorganic layer TL3 may be formed by repeatedly performing processes similar to the processes for forming the first light-emitting element ED1 and the first inorganic layer TL1.

Thereafter, although not specifically illustrated, second and third encapsulation layers TFE2 and TFE2 are formed on a first encapsulation layer TFE1 and the bank structure BNS, and a touch sensing layer TSU, a light-blocking layer BM, a color filter layer CFL, and an overcoat layer OC are formed, thereby obtaining the display device 10.

A display device according to another embodiment of the disclosure will hereinafter be described.

Figure 17:
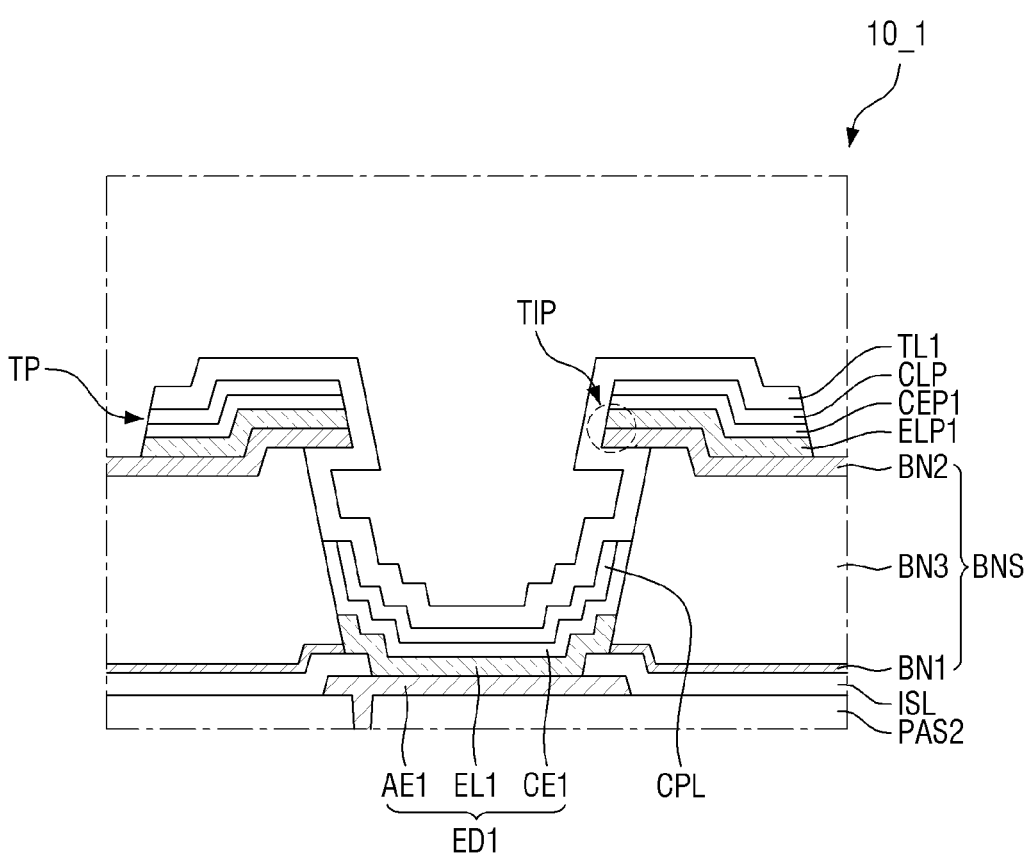
FIG. 17 is a cross-sectional view of an emission area of a display device according to another embodiment of the disclosure.

FIG. 17 is a cross-sectional view of an emission area of a display device according to another embodiment of the disclosure.

Referring to FIG. 17, a display device 10_1 may not include a sacrificial layer. In the display device 10_1, no sacrificial layer may be disposed on pixel electrodes (AE1, AE2, and AE3) of light-emitting elements (ED1, ED2, and ED3), and an inorganic insulating layer ISL may be disposed directly on the pixel electrodes (AE1, AE2, and AE3). The inorganic insulating layer ISL may be disposed to cover the edges of each of the pixel electrodes (AE1, AE2, and AE3). The inorganic insulating layer ISL may be in direct contact with parts of the top surfaces of the pixel electrodes (AE1, AE2, and AE3). Any gaps between the inorganic insulating layer ISL and the pixel electrodes (AE1, AE2, and AE3) may disappear, and any residual sacrificial layer pattern may remain. As no sacrificial layer is provided, the inorganic insulating layer ISL can be disposed directly on the pixel electrodes (AE1, AE2, and AEA3), and thus, light-emitting elements (EL1, EL2, and EL3) can be effectively prevented from being disconnected by tips in the inorganic insulating layer ISL.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
a first pixel electrode and a second pixel electrode disposed on a substrate to be spaced apart from each other;
an inorganic insulating layer disposed on the substrate, part of which being on the first pixel electrode and the second pixel electrode;
a bank structure disposed on the inorganic insulating layer and defining a first opening and a second opening therein, which overlap with the first pixel electrode and the second pixel electrode in a plan view, respectively;
a first light-emitting layer and a second light-emitting layer disposed on the first pixel electrode and the second pixel electrode, respectively; and
a first common electrode and a second common electrode disposed on the first light-emitting layer and the second light-emitting layer, respectively,
wherein
the bank structure includes a first bank layer, which is disposed directly on the inorganic insulating layer and includes $MoTaO_x$, a second bank layer, which is disposed on the first bank layer and includes $MoTaO_x$, and a third bank layer, which is disposed between the first bank layer and the second bank layer and includes copper (Cu),
the second bank layer includes tips, which protrude beyond the third bank layer, on sidewalls of the first opening and the second opening, and
the first bank layer and the second bank layer include different tantalum (Ta) contents from each other.

2. The display device of claim 1, wherein
the first bank layer includes a Ta content of 2 atomic percentages (at %) or less, and
the second bank layer includes a Ta content of 6 at % to 12 at %.

3. The display device of claim 2, wherein
the first bank layer has a thickness of 200 angstroms (Å) or less, and
the second bank layer has a thickness of 400 Å to 600 Å.

4. The display device of claim 2, wherein the third bank layer is thicker than each of the first bank layer and the second bank layer.

5. The display device of claim 1, wherein a side surface of the first bank layer is aligned with a side surface of the third bank layer in the first opening and the second opening.

6. The display device of claim 1, wherein the first common electrode and the second common electrode are in direct contact with side surfaces of the third bank layer.

7. The display device of claim 6, wherein
the first light-emitting layer and the second light-emitting layer are in direct contact with the side surfaces of the third bank layer, and
a contact area of the first light-emitting layer and the side surfaces of the third bank layer is less than a contact area of the first common electrode and the side surfaces of the third bank layer.

8. The display device of claim 1, wherein
the inorganic insulating layer is not in contact with top surfaces of the first pixel electrode and the second pixel electrode,
the first light-emitting layer is disposed in part between the first pixel electrode and the inorganic insulating layer, and
the second light-emitting layer is disposed in part between the second pixel electrode and the inorganic insulating layer.

9. The display device of claim 8, further comprising:
residual patterns disposed between the inorganic insulating layer and the first pixel electrode and between the inorganic insulating layer and the second pixel electrode.

10. The display device of claim 1, wherein
the inorganic insulating layer is disposed to be in direct contact with parts of top surfaces of the first pixel electrode and the second pixel electrode, and
parts of the first light-emitting layer and the second light-emitting layer are disposed directly on the inorganic insulating layer.

11. The display device of claim 1, further comprising:
a first organic pattern disposed on the second bank layer to surround the first opening and including a same material as the first light-emitting layer;
a first electrode pattern disposed on the first organic pattern and including a same material as the first common electrode;
a second organic pattern disposed on the second bank layer to surround the second opening and including a same material as the second light-emitting layer; and
a second electrode disposed on the second organic pattern and including a same material as the second common electrode.

12. The display device of claim 11, further comprising:
a first inorganic layer disposed on the sidewall of the first opening and on the first common electrode and the first electrode pattern; and
a second inorganic layer disposed on the sidewall of the second opening and on the second common electrode and the second electrode pattern, wherein the first inorganic layer and the second inorganic layer are spaced apart from each other, and part of the second bank layer does not overlap with the first inorganic layer and the second inorganic layer in the plan view.

13. The display device of claim 1, further comprising:

a thin-film encapsulation layer disposed on the bank structure, wherein the thin-film encapsulation layer includes a first encapsulation layer, a second encapsulation layer, which is disposed on the first encapsulation layer, and a third encapsulation layer, which is disposed on the second encapsulation layer.

14. The display device of claim 13, further comprising:

a light-blocking layer disposed on the third encapsulation layer and defining a plurality of opening holes, which overlap with the first opening and the second opening in the plan view, and a first color filter and a second color filter disposed on the light-blocking layer and overlapping with the first opening and the second opening in the plan view, respectively.

15. A method of fabricating a display device, comprising:

forming a plurality of pixel electrodes, which are spaced apart from one another, a sacrificial layer, which is disposed on the pixel electrodes, an inorganic insulating layer, which is disposed on the sacrificial layer, a first bank material layer, which is disposed on the inorganic insulating layer, a second bank material layer, which is disposed on the first bank material layer, and a third bank material layer, which is disposed between the first bank material layer and the second bank material layer, on a substrate;

forming a first hole, which overlaps with one of the pixel electrodes and exposes part of the sacrificial layer on the one of the pixel electrodes through the first, second, and third bank material layers and the inorganic insulating layer;

removing part of the sacrificial layer and forming tips in the second bank material layer, which protrude beyond a sidewall of the third bank material layer, by wet-etching a sidewall of the first hole;

forming a light-emitting layer and a common electrode on the pixel electrode in a first opening, which is obtained by the wet-etching the first hole, and forming an inorganic layer on the common electrode and the second bank material layer; and removing part of the inorganic layer on the second bank material layer, wherein the first bank material layer and the second bank material layer include $MoTaO_x$, but have different Ta contents from each other, and the third bank material layer includes copper (Cu).

16. The method of claim 15, wherein the first bank material layer includes a Ta content of 2 at % or less, and the second bank material layer includes a Ta content of 6 at % to 12 at %.

17. The method of claim 16, wherein the first bank material layer has a thickness of 200 Å or less, and the second bank material layer has a thickness of 400 Å to 600 Å.

18. The method of claim 15, wherein in the wet-etching of the sidewall of the first hole, the first bank material layer is partially etched and a sidewall of the first bank material layer is aligned with the sidewall of the third bank material layer after the wet-etching.

19. The method of claim 15, wherein the common electrode and the light-emitting layer are in contact with the sidewall of the third bank material layer, and a contact area of the common electrode and the third bank material layer is greater than a contact area of the light-emitting layer and the third bank material layer.

20. The method of claim 15, wherein the forming of the light-emitting layer and the common electrode, comprises forming an organic pattern, which is disposed on the second bank material layer and includes a same material as the light-emitting layer, and an electrode pattern, which is disposed on the organic pattern and includes a same material as the common electrode, and the inorganic layer is disposed on the electrode pattern.

* * * * *